(12) United States Patent
Min et al.

(10) Patent No.: US 12,396,301 B2
(45) Date of Patent: Aug. 19, 2025

(54) LIGHT EMITTING MODULE HAVING MOLDING LAYER INCLUDING LIGHT DIFFUSION LAYER AND BLACK MOLDING LAYER AND DISPLAY DEVICE HAVING THE SAME

(71) Applicant: SEOUL VIOSYS CO., LTD., Gyeonggi-do (KR)

(72) Inventors: Junhong Min, Gyeonggi-do (KR); Ik Kyu You, Gyeonggi-do (KR)

(73) Assignee: SEOUL VIOSYS CO., LTD., Ansan-si (KR)

( * ) Notice: Subject to any disclaimer, the term of this patent is extended or adjusted under 35 U.S.C. 154(b) by 677 days.

(21) Appl. No.: 17/692,699

(22) Filed: Mar. 11, 2022

(65) Prior Publication Data

US 2022/0293832 A1    Sep. 15, 2022

Related U.S. Application Data

(60) Provisional application No. 63/161,169, filed on Mar. 15, 2021, provisional application No. 63/306,280, filed on Feb. 3, 2022.

(51) Int. Cl.
*H10H 20/855* (2025.01)
*B29D 11/00* (2006.01)
(Continued)

(52) U.S. Cl.
CPC ..... *H10H 20/855* (2025.01); *B29D 11/00788* (2013.01); *B29D 11/00798* (2013.01); *H01L 25/0753* (2013.01); *H10H 20/0363* (2025.01)

(58) Field of Classification Search
CPC ............ H10H 20/855; B29D 11/00788; B29D 11/00798; H01L 25/0753
See application file for complete search history.

(56) References Cited

U.S. PATENT DOCUMENTS 10,517,155 B2   12/2019  Lee et al.
2015/0144918 A1*  5/2015  Cho ................ B29D 11/00788
                                                   257/40
(Continued)

FOREIGN PATENT DOCUMENTS

KR   10-2015-0059494    6/2015
KR   10-2019-0117706    10/2019
KR   10-2020-0029191    3/2020

OTHER PUBLICATIONS

International Search Report dated Jun. 27, 2022, issued to PCT/KR2022/003560.
(Continued)

*Primary Examiner* — Michael Jung
(74) *Attorney, Agent, or Firm* — Perkins Coie LLP

(57) ABSTRACT

A method of manufacturing a light emitting module includes mounting a plurality of unit pixels on a module substrate, thermally curing a light diffusion film and a black film, laminating the light diffusion film and the black film, forming a molding layer to surround side surfaces of the plurality of unit pixels by disposing the laminated light diffusion film and the black film on the module substrate, and pressing the light diffusion film and the black film; and cutting and removing edges of the module substrate and the molding layer. The molding layer includes a light diffusion layer and a black molding layer disposed on the light diffusion layer.

20 Claims, 21 Drawing Sheets

(51) Int. Cl.
*H01L 25/075* (2006.01)
*H10H 20/01* (2025.01)

(56) References Cited

U.S. PATENT DOCUMENTS

| | | |
|---|---|---|
| 2016/0197310 A1 | 7/2016 | Kubota et al. |
| 2020/0083397 A1 | 3/2020 | Lee et al. |
| 2020/0209674 A1* | 7/2020 | Won ......................... H04R 3/12 |
| 2020/0303605 A1 | 9/2020 | Jang et al. |

OTHER PUBLICATIONS

Supplementary European Search Report from corresponding related European Patent Application No. 22771719, dated Apr. 16, 2025.

* cited by examiner

LIGHT EMITTING MODULE HAVING MOLDING LAYER INCLUDING LIGHT DIFFUSION LAYER AND BLACK MOLDING LAYER AND DISPLAY DEVICE HAVING THE SAME

CROSS-REFERENCE OF RELATED APPLICATIONS AND PRIORITY

The Present Applications is a nonprovisional application which claims priority to and benefit of U.S. Provisional Application Ser. Nos. 63/161,169 filed Mar. 15, 2021 and 63/306,280 filed Feb. 3, 2022, the disclosure of which are incorporated by reference as if fully set forth herein.

TECHNICAL FIELD

Exemplary embodiments relate to a light emitting module, a method of manufacturing the same, and a display apparatus having the same, and more particularly, to a light emitting module having multiple molding layers, a method of manufacturing the same, and a display apparatus having the same.

BACKGROUND

A light emitting diode is an inorganic semiconductor device that emits light generated through recombination of electrons and holes. Recently, the light emitting diode is used in various fields such as display apparatuses, automobile lamps, general lighting, and the like. The light emitting diode has an advantage such as longer lifespan, lower power consumption, and quicker response than a conventional light source. Utilizing these advantages, it is rapidly replacing the conventional light source.

The light emitting diode has been generally used as a backlight light source in a display apparatus, but a display apparatus that directly realizes images using the light emitting diode has been developed. Such a display is also referred to as a micro LED display. Since the micro LED display does not require a backlight and a bezel portion can be minimized, it can be made compact and thin, and it has favorable luminance, resolution, power consumption, and durability.

In a case of the micro LED display, a micro LED is arranged on a two-dimensional plane corresponding to each sub pixel, and a large number of micro LEDs are mounted on a single substrate. The micro LED is very small with a width of 200 μm or less, and further 100 μm or less. The micro LED display can be fabricated in various resolutions and sizes because a fabrication process thereof is simple. However, there is a need for a technique to secure visibility without distortion or loss of luminance of light emitted from the light emitting diodes after mounting small-sized light emitting diodes on a circuit board. In addition, in order to improve an image quality of the display apparatus using the light emitting diode as a direct light source, a technique for reducing a color change is also required.

SUMMARY

Exemplary embodiments of the present disclosure provide a light emitting module having an improved structure so as to minimize loss of luminance and secure visibility, a method of manufacturing the same, and a display apparatus having the same.

Exemplary embodiments of the present disclosure provide a light emitting module having an improved structure so as to alleviate a color change that may be caused by a circuit board on which a light emitting diode is mounted and minimize loss of luminance, a method of manufacturing the same, and a display apparatus having the same.

A method of manufacturing a light emitting module according to an exemplary embodiment of the present disclosure may include: mounting a plurality of unit pixels on a module substrate; preparing a light diffusion film and a black film, at least one of the light diffusion film and the black film including a pattern on an upper surface thereof; laminating the light diffusion film and the black film; forming a molding layer to surround side surfaces of the plurality of unit pixels by disposing the laminated light diffusion film and the black film on the module substrate, and pressing the light diffusion film and the black film; and removing edges of the module substrate and the molding layer by cutting them, in which the molding layer includes a light diffusion layer and a black molding layer disposed on the light diffusion layer.

Each of the plurality of unit pixels may include a first LED stack, a second LED stack, and a third LED stack stacked in a vertical direction.

The second LED stack may be disposed between the first LED stack and the third LED stack, and the third LED stack may emit light having a shorter wavelength than that of the first LED stack and emit light having a longer wavelength than that of the second LED stack.

Each of the plurality of unit pixels may include at least three light emitting devices emitting light of different colors from one another, and the at least three light emitting devices may be arranged on a same plane.

Laminating the light diffusion film and the black film may include thermally curing the light diffusion film and the black film at a temperature of about 50° C., respectively.

Laminating the light diffusion film and the black film may include roll lamination of the light diffusion film and the black film.

Forming the molding layer may include vacuum laminating the light diffusion film and the black film by pressing them with a uniform pressure at a temperature of about 60° C.

The method of manufacturing the light emitting module may further include laminating the light diffusion film with a transparent film before laminating the light diffusion film and the black film, in which the molding layer may further include a transparent molding layer opposite to the black molding layer and disposed under the light diffusion layer.

The light diffusion layer may include at least one of a thermosetting material and a photosensitive material, and the black molding layer may include at least one of a thermosetting material and a photosensitive material.

The light diffusion layer may include at least one of an acrylic-based, silicone-based, or urethane-based resin, and the black molding layer may include at least one of an acrylic-based, silicone-based, or urethane-based resin.

The light diffusion layer and the black molding layer may include a light absorber or a dye.

The pattern of the light diffusion film may be formed by pressing an upper portion of the thermally cured light diffusion film with a stamp after thermally curing the light diffusion film, and the pattern of the black film may be formed by pressing an upper portion of the thermally cured black film with a stamp after thermally curing the black film.

Elements of the pattern of the light diffusion layer and elements of the pattern of the black molding layer may overlap one another.

The elements of the pattern of the light diffusion layer and the elements of the pattern of the black molding layer may not overlap one another in a vertical direction.

A method of manufacturing a light emitting module may include: mounting a plurality of unit pixels on a module substrate; forming a light diffusion layer to surround side surfaces of the plurality of unit pixels by disposing the light diffusion film on the module substrate, and pressing it; forming a black molding layer by disposing the black film on the light diffusion layer, and pressing it; and removing edges of the module substrate, the light diffusion layer, and the black molding layer by cutting them.

The step of forming the light diffusion layer may include vacuum laminating the light diffusion layer by pressing it with a uniform pressure at a temperature of about 60° C.

The step of forming the black molding layer may include vacuum laminating the black molding layer by pressing it with a uniform pressure at a temperature of about 60° C.

Before the step of forming the black molding layer, a step of forming a pattern in an upper portion of the light diffusion layer may be further included.

A light emitting module according to an exemplary embodiment may include: a module substrate; a plurality of unit pixels disposed on the module substrate; and a molding layer covering the plurality of unit pixels, in which the molding layer may include a light diffusion layer and a black molding layer, at least one of the light diffusion layer and the black molding layer may include a pattern, and a side surface of the module substrate, a side surface of the light diffusion layer, and a side surface of the black molding layer may be located on a same plane.

Each of the light diffusion layer and the black molding layer may include a pattern on an upper surface thereof.

Each element of the pattern may be a hemispherical, conical, or grid pattern.

The light diffusion layer may include a convex portion on the plurality of unit pixels.

Further, the light diffusion layer may include a pattern, and an interval between elements of the pattern on the convex portion may be greater than an interval between the elements of the pattern on the upper surface of the light diffusion layer disposed in a region between the unit pixels.

The black molding layer may include a pattern, and elements of the pattern of the black molding layer may be spaced apart from one another at a substantially constant interval.

A thickness from an uppermost end of the light diffusion layer on the plurality of unit pixels to the module substrate may be greater than or equal to a thickness from the upper surface of the light diffusion layer disposed in the region between the unit pixels to the module substrate.

A thickness of the light diffusion layer disposed in the region between the unit pixels may be greater than a thickness of the unit pixels.

Each of the plurality of unit pixels may include a first LED stack, a second LED stack, and a third LED stack that are vertically stacked, or may include at least three light emitting devices arranged on a transparent substrate.

A display apparatus according to an exemplary embodiment may include a display substrate; and a plurality of light emitting modules arranged on the display substrate, in which each of the light emitting modules may include: a module substrate; and a light diffusion layer and a black molding layer disposed on the module substrate, in which at least one of the light diffusion layer and the black molding layer may include a pattern, a side surface of the module substrate, a side surface of the light diffusion layer, and a side surface of the black molding layer may be located on a same plane.

DESCRIPTION OF DRAWINGS

FIG. 3A illustrates a plurality of unit pixels mounted on a module substrate;

FIG. 3B illustrates preparing a light diffusion film and a black film and forming patterns on upper surfaces of the light diffusion film and the black film;

FIG. 3C illustrates thermally curing each film;

FIG. 3D illustrates disposing the laminated light diffusion film and the black film on the module substrate and forming a light diffusion layer and a black molding layer; and FIG. 3E illustrates completing the light emitting module by cutting edges of the module substrate.

FIG. 4A illustrates a plurality of unit pixels mounted on a module substrate;

FIG. 4B illustrates preparing a light diffusion film and a black film and forming patterns on upper surfaces of the light diffusion film and the black film;

FIG. 4C illustrates thermally curing each film;

FIG. 4D illustrates forming a light diffusion layer and a black molding layer; and FIG. 4E illustrates completing the light emitting module by cutting edges of the module substrate.

FIG. 5A illustrates a plurality of unit pixels mounted on a module substrate;

FIG. 5B illustrates preparing a light diffusion film with flat upper and lower surfaces and a black film;

FIG. 5C illustrates thermally curing each film;

FIG. 5D illustrates forming a light diffusion layer and a black molding layer; and FIG. 5E illustrates manufacturing the light emitting module by cutting the module substrate.

FIG. 7A illustrates a plurality of unit pixels mounted on a module substrate;

FIG. 7B illustrates disposing a light diffusion film on the plurality of unit pixels;

FIG. 7C illustrates forming a light diffusion layer on the module substrate;

FIG. 7D illustrates forming a first pattern on an upper surface of the light diffusion layer;

FIG. 7E illustrates forming a black molding layer on the light diffusion layer using a black film; and FIG. 7F illustrates forming a second pattern on an upper surface of the black molding layer; and FIG. 7G illustrates completing a light emitting module by cutting and removing edges of the module substrate, the light diffusion layer, and the black molding layer.

FIG. 8A illustrates a plurality of unit pixels mounted on a module substrate;

FIG. 8B illustrates preparing a light diffusion film and a black film by forming a pattern on upper surfaces thereof;

FIG. 8C illustrates an additional step of forming the light diffusion film by laminating a plurality of films;

FIG. 8D illustrates thermally curing the light diffusion film and the black film on the module substrate;

FIG. 8E illustrates disposing the laminated light diffusion film and the black film on the module substrate; and FIG. 8F illustrates manufacturing the light emitting module by cutting edges of the module substrate.

DETAILED DESCRIPTION OF THE ILLUSTRATED EMBODIMENTS

Figure 1A:
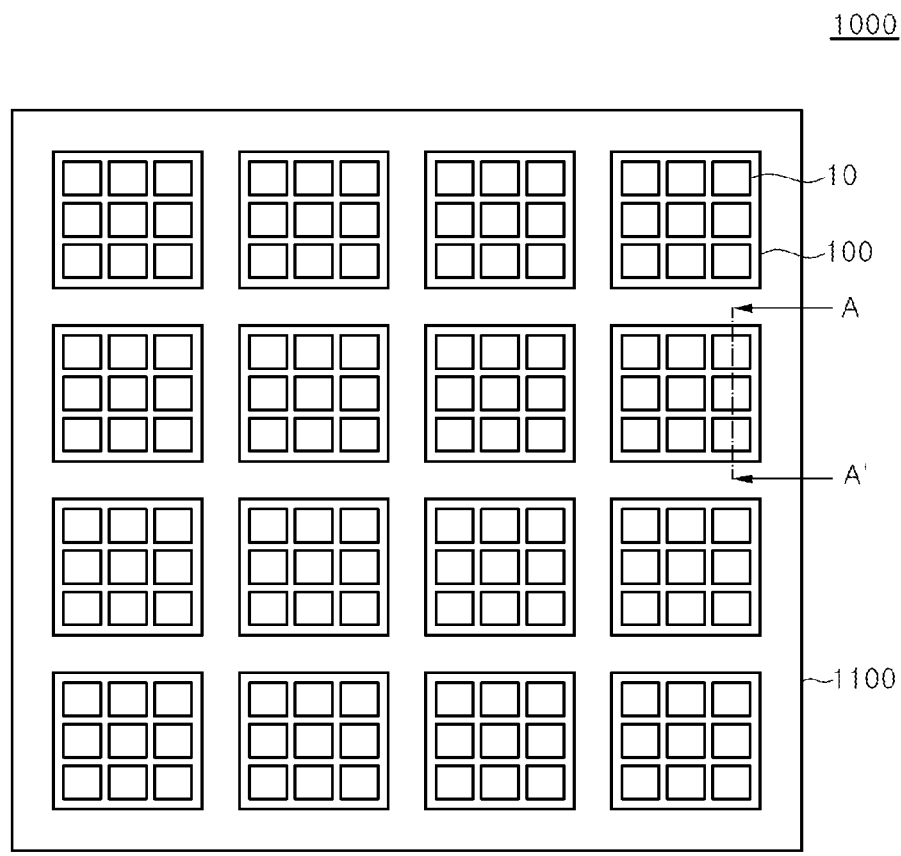
FIG. 1A is a plan view illustrating a display apparatus according to an exemplary embodiment.

Hereinafter, exemplary embodiments of the present disclosure will be described in detail with reference to the accompanying drawings. The following exemplary embodiments are provided by way of example so as to fully convey the spirit of the present disclosure to those skilled in the art to which the present disclosure pertains. Accordingly, the present disclosure is not limited to the embodiments disclosed herein and can also be implemented in different forms. In the drawings, widths, lengths, thicknesses, and the like of elements can be exaggerated for clarity and descriptive purposes. When an element or layer is referred to as being "disposed above" or "disposed on" another element or layer, it can be directly "disposed above" or "disposed on" the other element or layer or intervening elements or layers can be present. Throughout the specification, like reference numerals denote like elements having the same or similar functions.

Figure 1B:
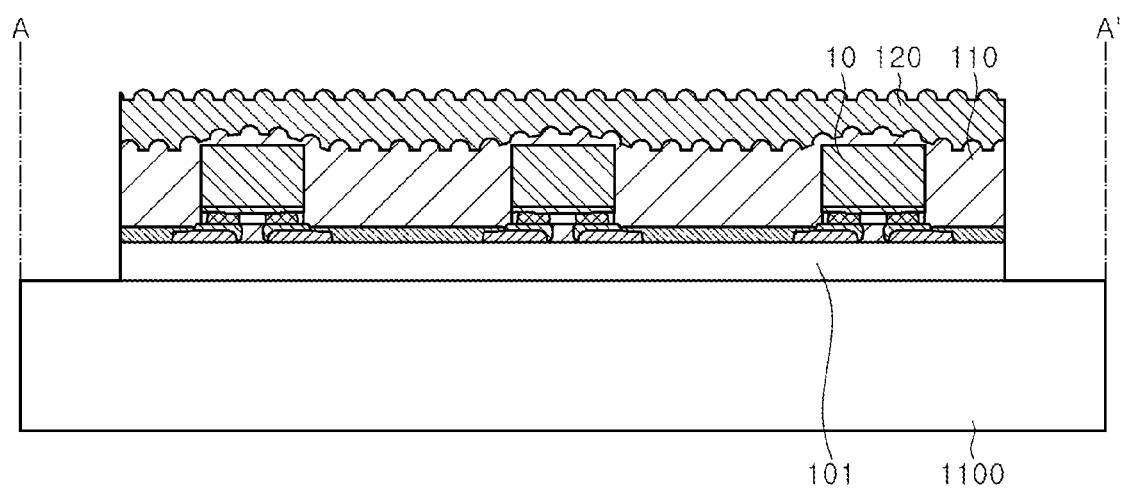
FIG. 1B is a schematic cross-sectional view taken along line A-A' of FIG. 1A.

FIG. 1A is a plan view illustrating a display apparatus 1000 according to an exemplary embodiment, and FIG. 1B is a schematic cross-sectional view taken along line A-A' of FIG. 1A.

Referring to FIGS. 1A and 1B, the display apparatus 1000 may include a panel substrate 1100, and a plurality of light emitting modules 100. The light emitting module 100 includes a module substrate 101, a plurality of unit pixels 10 disposed on the module substrate 101, and a molding layer covering the plurality of unit pixels. The molding layer may include a light diffusion layer 110 and a black molding layer 120.

The panel substrate 1100 may be formed of a material such as polyimide (PI), FR4, or glass, and may include a circuit for passive matrix driving or active matrix driving. In addition, the panel substrate 1100 may include an interconnection and a resistor, without being limited thereto, or the panel substrate 1100 may include an interconnection, a transistor, a capacitor, and the like. The panel substrate 1100 may have pads electrically connected to a circuit on an upper surface thereof. The plurality of light emitting modules 100 may be arranged on the panel substrate 1100.

Although the panel substrate 1100 has been described as including the circuit in the present exemplary embodiment, the panel substrate 1100 does not necessarily include the circuit. For example, the panel substrate 1100 may function as supporting the light emitting modules 100 and include no circuit. Furthermore, the light emitting modules 100 may be arranged on a frame instead of the panel substrate 1100.

The plurality of light emitting modules 100 may be arranged in a matrix form on the panel substrate 1100. The plurality of light emitting modules 100 may be arranged in 3×3 as shown in FIG. 1A, without being limited thereto. Alternatively, the plurality of light emitting modules 100 may be arranged in various matrices such as 4×4, 5×5, 6×6 (n×m, n=1, 2, 3, 4, . . . , m=1, 2, 3, 4, . . . ).

Each of the light emitting modules 100 may include the module substrate 101, the plurality of unit pixels 10 arranged on the module substrate 101, and the molding layer covering the plurality of unit pixels 10. In addition, the molding layer may include the light diffusion layer 110 disposed to surround the plurality of unit pixels 10 and the black molding layer 120 disposed on the light diffusion layer 110.

Hereinafter, each element of the display apparatus 1000 and a manufacturing method thereof will be described in detail in an order of the light emitting module 100 disposed in the display apparatus 1000, and the plurality of unit pixels 10 arranged in the light emitting module 100.

Figure 2A:
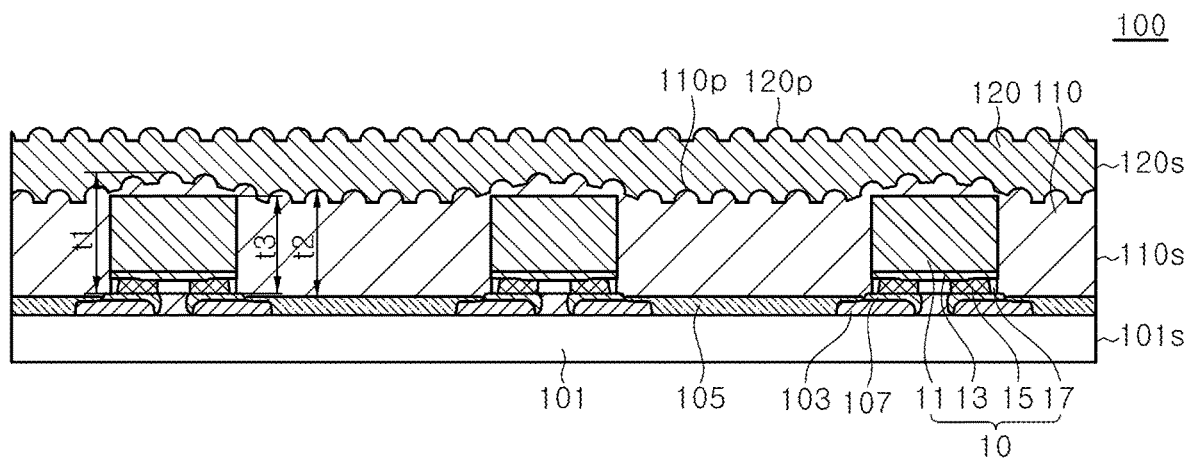
FIG. 2A is a schematic partial cross-sectional view illustrating an enlarged view of a light emitting module of FIG. 1A.
Figure 2B:
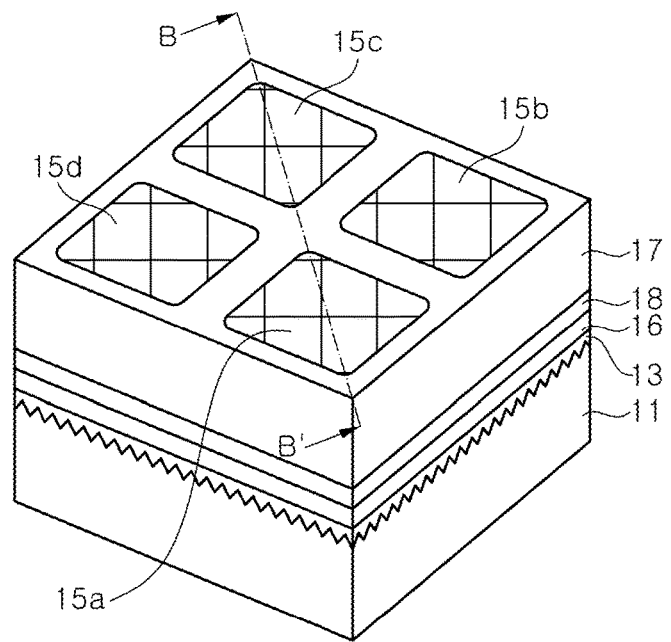
FIG. 2B is a schematic perspective view illustrating an enlarged view of a unit pixel of FIG. 2A.
Figure 2C:
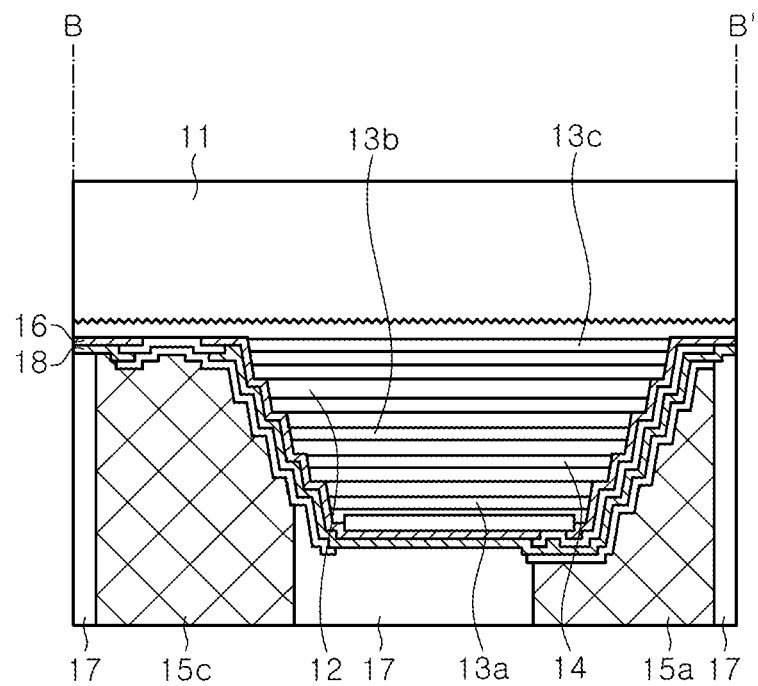
FIG. 2C is a schematic cross-sectional view taken along line B-B' of FIG. 2B.
Figure 2D:
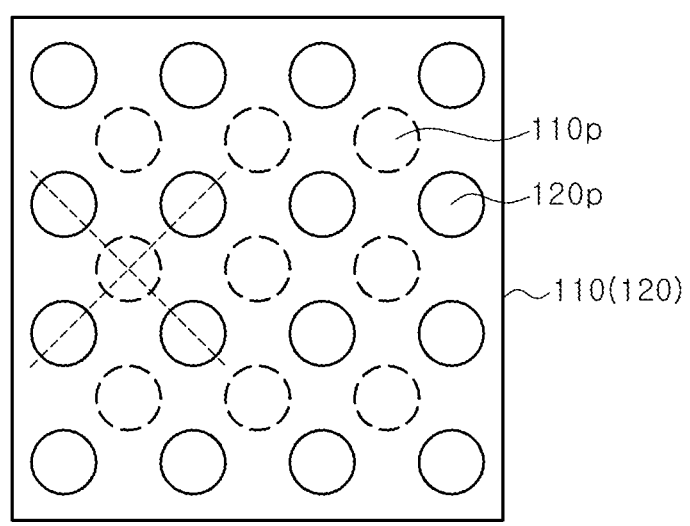
FIG. 2D is a schematic partial plan view illustrating an enlarged view of the light emitting module of FIG. 2A.

FIG. 2A is a partial cross-sectional view illustrating an enlarged view of the light emitting module of FIG. 1A, FIG. 2B is a perspective view illustrating an enlarged view of the unit pixel of FIG. 2A, FIG. 2C is a schematic cross-sectional view taken along line B-B' of FIG. 2B, and FIG. 2D is a schematic partial plan view illustrating an enlarged view of the light emitting module of FIG. 2A.

Referring to FIGS. 2A, 2B, and 2C, the light emitting module 100 may include the module substrate 101, the plurality of unit pixels 10 disposed on the module substrate 101, the light diffusion layer 110 and the black molding layer 120.

The module substrate 101 may include a circuit connected to the plurality of unit pixels 10. In an exemplary embodiment, the module substrate 101 may include, for example, a circuit for electrically connecting the panel substrate 1100 and the plurality of unit pixels 10. The circuit in the module substrate 101 may be formed in a multi-layered structure. In an exemplary embodiment, the module substrate 101 may include a passive circuit for driving the plurality of unit pixels 10 in a passive matrix driving manner or an active circuit for driving the plurality of unit pixels 10 in an active matrix driving manner. The module substrate 101 may include pads 103 for electrical connection to the unit pixel 100.

A black protection layer 105 may be disposed on the module substrate 101, and the black protection layer 105 may be in contact with the module substrate 101. In more detail, the black protection layer 105 may be formed so as to expose at least portions of the module substrate 101 and the pad 103 on the module substrate 101. An upper surface of the black protection layer 105 may be substantially flat compared to a lower surface thereof.

The black protection layer 105 may be formed using Photo Solder Resist (PSR) ink containing black dye, and may be patterned through a photolithography without an additional resist solution, without being limited thereto. In addition, the PSR ink may include a polyfunctional monomer, an epoxy resin, and an epoxy curing accelerator.

The black protection layer 105 may block soldering to prevent electrical short-circuiting of adjacent pads, and may protect the module substrate 101. In addition, the black protection layer 105 may prevent light emitted from the unit pixel 10 from diffusing to a side thereof and absorb external light to improve blackness.

The unit pixel 10 may be mounted on the module substrate 101. Referring to FIGS. 2B to 2D, in the illustrated exemplary embodiment, the unit pixel 10 may include a substrate 11, a light emitting structure 13, connection electrodes 15a, 15b 15c, and 15d, and a protection layer 17.

Light emitted from the unit pixel 10 may be emitted upward from the module substrate 101. For example, light emitted from the unit pixel 10 may be emitted to the outside of the unit pixel 10 through the substrate 11. The substrate 11 may include a light-transmitting insulating material so as to transmit light generated from the light emitting structure 13. The substrate 11 may transmit only light having a specific wavelength or may transmit only a portion of light having a specific wavelength. The substrate 11 may be transparent, translucent, or partially transparent to light generated from the light emitting structure 13. The substrate 11 may be a growth substrate capable of epitaxially growing the light emitting structure 13, for example, a sapphire substrate. However, the substrate 11 is not limited to the sapphire substrate, and may include various other transparent insulating materials. For example, the substrate may include glass, quartz, silicon, organic polymer, or an organic-inorganic composite material, and it may be, for example, silicon carbide (SiC), gallium nitride (GaN), indium gallium nitride (InGaN), aluminum gallium nitride (AlGaN), aluminum nitride (AlN), gallium oxide ($Ga_2O_3$), or a silicon substrate. In addition, the substrate may include irregularities on a surface in contact with the light emitting structure 13, and it may be, for example, a patterned sapphire substrate.

In the illustrated exemplary embodiment, at least a portion of the substrate 11 may remain to form a portion of the unit pixel 10, without being limited thereto, or after the growth of the semiconductor layers is completed, the substrate 11 may be removed from the semiconductor layers using a technique such as mechanical polishing, laser lift-off, chemical lift-off, or the like. When the substrate 11 is removed, light generated from the light emitting structure 13 may be emitted to an upper portion of the module substrate 101 through the light emitting structure 13.

The substrate 11 may have an upper surface and a lower surface opposite to each other, and the light emitting structure 13 may be formed on the lower surface of the substrate 11. When the unit pixel 10 includes the substrate 11, the light emitting structure 13 may be disposed between the module substrate 101 and the substrate 11, and light generated from the light emitting structure 13 may pass through the lower surface and upper surface of the substrate 11 sequentially to exit to the outside.

The light emitting structure 13 may have a structure in which LED stacks emitting light having different wavelengths are stacked in a vertical direction, without being limited thereto, or may have an LED stack structure emitting light having a single wavelength.

In an exemplary embodiment, the light emitting structure 13 may include a first LED stack 13a, a second LED stack 13b, and a third LED stack 13c stacked in the vertical direction, as shown in FIG. 2C. The first, second, and third LED stacks 13a, 13b, and 13c may include a first conductivity type semiconductor layer, an active layer, and a second conductivity type semiconductor layer, respectively. The first and second conductivity type semiconductor layers may have a single-layer structure or a multi-layer structure, and may include a superlattice layer, respectively. In addition, the active layers may have a single quantum well structure or a multiple quantum well structure.

The first, second and third LED stacks 13a, 13b, and 13c may be configured to emit light toward the substrate 11. Accordingly, light emitted from the first LED stack 13a may pass through the second LED stack and the third LED stack 13b and 13c. The first, second, and third LED stacks 13a, 13b, and 13c may emit light having different peak wavelengths from one another. In general, the LED stack disposed farther from the substrate 11 emits light having a longer wavelength than that of light emitted from the LED stack disposed closer to the substrate 11, and thus, light loss may be reduced. However, the inventive concepts are not limited thereto. For example, to adjust a color mixing ratio of the first, second, and third LED stacks 13a, 13b, and 13c, the second LED stack 13b may emit light having a shorter wavelength than that of light emitted from the third LED stack 13c. Accordingly, it is possible to reduce a luminous intensity of the second LED stack 13b and increase a luminous intensity of the third LED stack 13c, and thus, a luminous intensity ratio of light emitted from the first, second, and third LED stacks 13a, 13b, and 13c may be changed. For example, the first LED stack 13a may be configured to emit red light, the second LED stack 13b to emit blue light, and the third LED stack 13c to emit green light. Accordingly, it is possible to relatively reduce a luminous intensity of blue light and relatively increase a luminous intensity of green light. In addition, the third LED stack 13c closer to the substrate 11 may have a light emitting area larger than those of the first and second LED stacks 13a and 13b. Accordingly, by disposing the third LED stack 13c emitting green light closest to the substrate 11, a relative luminous intensity of green light compared to those of red light and blue light may be further increased. Alternatively, to increase color rendering, the third LED stack 13c disposed closest to the substrate 11 may be configured to emit red light, and a stacking order of the first, the second, and the third LED stacks 13a, 13b, and 13c may be modified in various combinations.

When the first LED stack 13a emits red light, a peak wavelength of red light may be 600 nm to 670 nm, and the semiconductor layers may include aluminum gallium arsenide (AlGaAs), gallium arsenide phosphide GaAsP), aluminum gallium indium phosphide (AlGaInP), and gallium phosphide (GaP).

When the second LED stack 13b emits blue light, a peak wavelength of blue light may be 400 nm to 490 nm, and the semiconductor layers may include gallium nitride (GaN), indium gallium nitride (InGaN), or zinc selenide (zinc selenide, ZnSe).

When the third LED stack 13c emits green light, a peak wavelength of green light may be 500 nm to 590 nm, and the semiconductor layers may include indium gallium nitride (InGaN), gallium nitride (GaN), gallium phosphide (GaP), aluminum gallium indium phosphide (AlGaInP), or aluminum gallium phosphide (AlGaP).

A bonding layer may be formed between each of the LED stacks, and the first, second, and third LED stacks 13a, 13b, and 13c may be coupled to one another by the bonding layer. A first bonding layer 12 may be disposed between the first and second LED stacks 13a and 13b, and a second bonding layer 14 may be disposed between the second LED stack 13b and the third LED stack 13c. The first and second bonding layers 12 and 14 may include a non-conductive material that transmits light. The bonding layers 12 and 14 may include an optically transparent adhesive (OCA), and may include, for example, epoxy, polyimide, SUB, spin-on-glass (SOG), or benzocyclobutene (BCB), without being limited thereto.

According to the illustrated exemplary embodiment, a first insulation layer 16 and a second insulation layer 18 may be disposed on at least portions of side surfaces of the first, second and third LED stacks 13a, 13b, and 13c. At least one of the first and second insulation layers 16 and 18 may include various organic or inorganic insulating materials, such as polyimide, $SiO_2$, SiNx, $Al_2O_3$, or the like. For example, at least one of the first and second insulation layers 16 and 18 may include a distributed Bragg reflector (DBR). As another example, at least one of the first and second insulation layers 16 and 18 may include a black organic polymer. In addition, an electrically floating metal reflection layer may be disposed on the first and second insulation layers 16 and 18 to reflect light emitted from the LED stacks 13a, 13b and 13c toward the substrate 11. At least one of the first and second insulation layers 16 and 18 may have a single-layer structure or a multi-layer structure formed of two or more insulation layers having different refractive indices from each other.

In addition, each of the first, second, and third LED stacks 13a, 13b, and 13c may be driven independently. In more detail, a common voltage may be applied to one of the first and second conductivity type semiconductor layers of each of the LED stacks 13a, 13b, and 13c, and an individual light emitting signal may be applied to another one of the first and second conductivity type semiconductor layers of each of the LED stacks 13a, 13b, and 13c. For example, the first conductivity type semiconductor layer of each LED stack may be an n-type, and the second conductivity type semiconductor layer may be a p-type. Further, the third LED stack 13c may have a stacked sequence in reverse compared to those of the first and second LED stacks 13a and 13b.

Each of the p-type semiconductor layers of the LED stacks 13a, 13b, and 13c may be connected to a fourth connection electrode 15d. The fourth connection electrode 15d may receive a common voltage from the outside. Meanwhile, the n-type semiconductor layers of the LED stacks 13a, 13b, and 13c may be connected to a first connection electrode 15a, a second connection electrode 15b, and a third connection electrode 15c, respectively, to receive a respective corresponding light emitting signal through the connection electrodes 15a, 15b, and 15c. In this manner, each of the first, second, and third LED stacks 13a, 13b, and 13c may be independently driven while having a common p-type structure in which p-type semiconductor layers of the first, second, and third LED stacks 13a, 13b, and 13c are commonly connected to one electrode. In the present disclosure, the unit pixels 10 have the common p-type structure, without being limited thereto, or they may have a common n-type structure. In addition, the stacking sequence of each LED stack is not limited to that shown in FIG. 2C but the stacking sequence may be variously modified.

The protection layer 17 may cover at least a portion of a lower surface of the light emitting structure 13, and may surround side surfaces of the connection electrodes 15. In addition, the protection layer 17 may be formed between the connection electrodes 15a, 15b, 15c, and 15d. The protection layer 17 may be formed flush with lower surfaces of the connection electrodes 15a, 15b, 15c, and 15d by a polishing process or the like. The protection layer 17 may include a black epoxy molding compound (EMC), without being limited thereto. For example, the protection layer 17 may include a photosensitive polyimide dry film (PID). The protection layer 17 may provide a sufficient contact area to the unit pixel 10 so as to facilitate handling as well as so as to protect the light emitting structure 13 from external impacts that may occur while a subsequent process is applied. In addition, the protection layer 17 may prevent light leakage from a side surface of the unit pixel 10 to prevent or at least suppress interference of light emitted from the adjacent unit pixel 10.

However, the inventive concepts are not limited thereto, and the unit pixel 10 may include at least three light emitting devices emitting light of different colors arranged on the same plane. For example, the three light emitting devices may emit red light, green light, and blue light, respectively, and the light emitting devices of red light, green light, and blue light may be sequentially arranged. This will be described in detail later with reference to FIG. 9.

The plurality of unit pixels 10 may be mounted on the module substrate 101 by bonding the connection electrode 15 to pads 103 of the module substrate 101 using a bonding agent 107. The bonding agents 107 may cover at least portions of an upper surface and a side surface of the pad 103 of the module substrate 101. A portion of the bonding agent 107 formed on an upper surface of the pad 103, as shown in FIG. 2A, may be disposed outward from a side surface of the unit pixel 10.

The bonding agent 107 may be solder. For example, after disposing a solder paste on pads on the module substrate 101 using a screen printing technique, the unit pixel 10 and the module substrate 101 may be bonded through a reflow process. However, the inventive concepts are not limited thereto, and the unit pixel 10 and the module substrate 101 may be connected by eutectic bonding, epoxy bonding, anisotropic conductive film (ACF) bonding, ball grid array (BGA), or the like.

The light diffusion layer 110 may be formed to surround the plurality of unit pixels 10. The light diffusion layer 110 may be formed on the plurality of unit pixels 10 and the module substrate 101, and in more detail, may cover a lower surface, a side surface, and an upper surface of the unit pixel 10. Since the light diffusion layer 110 surrounds the plurality of unit pixels 10 to block light extracted to the side, a viewing angle may be reduced, and it is possible to prevent a boundary line between adjacent unit pixels from being seen.

The light diffusion layer 110 may have a uniform pattern on an upper surface thereof. Elements 110p of the pattern may be protrusions, without being limited thereto, or may be concave portions. The light diffusion layer 110 may form uniform patterns 110p on an upper surface thereof. In the illustrated exemplary embodiment, the elements 110p may have a hemispherical shape, without being limited thereto, it may have, for example, various shapes such as a cone and a grid pattern, or it may be formed in a shape different from that of elements of a pattern 120p of the black molding layer 120 which will be described later. The pattern of the elements 110p may generate diffused reflection of light emitted from the unit pixel 10 to improve visibility by light scattering, improve light extraction efficiency, and improve clarity and smoothness of a surface. In addition, viewing angle characteristics of the display apparatus 1000 may be improved by refracting light.

The light diffusion layer 110 may be formed by a vacuum lamination process in which an opaque light diffusion film, which is an organic polymer sheet, is disposed on the unit pixel 10 and a high temperature and a high pressure are applied in a vacuum state. Accordingly, at least a portion of the upper surface of the light diffusion layer 110 may include a convex portion on an upper portion of the unit pixel 10. However, the inventive concepts are not limited thereto, and when a thickness of the light diffusion layer 110 is sufficiently larger than that of the unit pixel 10, a uniform upper surface without the convex portion may be formed.

As shown in FIG. 2A, a vertical thickness t1 from an uppermost end of the convex portion of the light diffusion layer 110 to the module substrate 101 may be greater than a thickness t3 of the unit pixel 10. In addition, a vertical thickness t2 from an upper surface of the element 110p of the pattern of the light diffusion layer 110 disposed between each of the unit pixels 10 to the module substrate 101 may be greater than the thickness t3 of the unit pixel 10. Herein, the vertical thickness t2 represents a distance from the element 110p of the pattern located in a center between the unit pixels 10 to the module substrate 101. As such, the thicknesses t1 and t2 of the light diffusion layer 110 may be greater than the thickness t3 of the unit pixel 10, without being limited thereto, and the light diffusion layer 110 may be formed to have a thickness at least corresponding to the thickness t3 of the unit pixel 10, so that the upper surfaces of the light diffusion layer 110 and the unit pixel 10 may be located on the same line. The thickness t3 of the unit pixel 10 may be, for example, about 10 μm to about 200 μm, and the thickness of the light diffusion layer 110 may be identical to or greater than the thickness of the unit pixel 10. For example, the thickness of the unit pixel 10 may be about 170 μm, and the thickness of the light diffusion layer 110 may be 170 μm to 200 μm, without being limited thereto.

Meanwhile, in a case that the thicknesses t1 and t2 of the light diffusion layer 110 are smaller than the thickness t3 of the unit pixel 10, a shape of the pattern may be deformed when the light diffusion layer 110 is formed on the unit pixel 10 by the vacuum lamination process. In addition, as shown in FIG. 2A, an interval between the elements 110p disposed over the unit pixels 10 may be different from an interval between the elements 110p disposed in a region between the unit pixels 10. For example, as shown in FIG. 2A, the interval between the elements 110p disposed over the unit pixels 10 may be greater than the interval between the elements 110p disposed in the region between the unit pixels 10.

A width of the light diffusion layer 110 may be identical to a width of the module substrate 101. Accordingly, a side surface of the light diffusion layer 110 may be disposed on the same plane as a side surface of the module substrate 101.

The light diffusion layer 110 may be formed of a film-type material, and may be formed, for example, using a thermosetting resin. However, the inventive concepts are not limited thereto, the light diffusion layer 110 may be formed by jetting, dispensing, or being applied with a material in a form of a molding solution, or may be formed using an ultraviolet curable resin. The material of the light diffusion layer 110 may include an epoxy-based, silicone-based, or urethane-based resin. The material of the light diffusion layer 110 may be transparent, or may be black, white, or gray.

In addition, the light diffusion layer 110 may include a diffusion agent (not shown) or a scattering agent for diffusing light emitted from the unit pixel 10. As the diffusing agent or the scattering agent included in the light diffusion layer 110 diffuses light emitted from the unit pixel 10, light loss may be reduced, and a visual image may be improved by alleviating a color tone change by removing an optical distortion of the display apparatus 1000. In the present disclosure, the diffusing agent may be titanium oxide, without being limited thereto, or may be, for example, calcium carbonate, barium sulfate, silica, acrylic beads, glass beads, or others. A degree of light diffusion may be adjusted by adjusting a density, a size, and a thickness of the diffusion agent.

The light diffusion layer 110 may be a single layer, without being limited thereto, or may be a plurality of layers, and the number of the plurality of layers is not limited. In another exemplary embodiment, the light diffusion layer 110 may include a plurality of layers having different colors form one another.

The black molding layer 120 may cover the upper surface of the light diffusion layer 110 so as to improve optical characteristics of the unit pixel. A width of the black molding layer 120 may be identical to that of the light diffusion layer 110 and that of the module substrate 101. Accordingly, a side surface 120s of the light diffusion layer 120 may be disposed on a same plane as a side surface 110s of the light diffusion layer 110 and a side surface 101s of the module substrate 101.

The black molding layer 120 may be formed to have a thickness smaller than that of the light diffusion layer 110. A sum of the thickness of the black molding layer 120 and the thickness of the light diffusion layer 110 may be about 400 μm or less, for example, about 250 μm when the thickness of the unit pixel 110 is 170 μm. However, the inventive concepts are not limited thereto.

The black molding layer 120 may be disposed so as to maintain blackness of the display apparatus 1000 and so as to reduce reflectivity. The black molding layer 120 may improve uniformity of extracted light by reducing a color tone change caused by the module substrate 101.

The black molding layer 120 may include a uniform pattern of elements 120p on an upper surface thereof. The elements 120p may be protrusions, without being limited thereto, or may be concave portions. In the illustrated exemplary embodiment, the elements 120p may have a hemispherical shape, without being limited thereto, it may have, for example, various shapes such as a cone and a grid pattern, or it may be formed in a shape different from that of the element 110p of the light diffusion layer 110. The elements 120p may generate diffuse reflection of light emitted from the unit pixel 10 to improve visibility by light scattering, improve light extraction efficiency, and improve clarity and smoothness of a surface. In addition, the elements 120p refract light, and thus, viewing angle characteristics of the display apparatus 1000 may be improved.

The light diffusion layer 110 may include a convex portion on the unit pixel 10, and thus, an interval between the elements 110p of the pattern on the convex portion may be greater than an interval of the elements 110p of the pattern in the region between the unit pixels 10. In contrast, in the black molding layer 120, an interval of the elements 120p of the pattern in the upper region of the unit pixels 10 and those in the region between the unit pixels may be substantially identical. For example, an upper surface of the black molding layer 120 may not be deformed by the convex portion of the light diffusion layer 110. Accordingly, a thickness of the black molding layer 120 over the unit pixels 10 may be smaller than that of the black molding layer 120 disposed in the region between the unit pixels 10. However, the inventive concepts are not necessarily limited thereto.

In an exemplary embodiment of the present disclosure, referring to FIG. 2D, the elements 110p of the pattern of the light diffusion layer 110 and the elements 120p of the pattern of the black molding layer 120 may be disposed without overlapping one another in the vertical direction, and may be formed to be spaced apart from one another at equal intervals. For example, a center of one element 110p of the light diffusion layer 110 may be disposed at a center of the elements 120p of the black molding layer 120 disposed at equal intervals around the one element 110p. For example, as shown by a dotted line in FIG. 2D, one element 110p of the light diffusion layer 110 may be located on the same axis as an intersection of a straight line connecting the centers of the elements 120p located on each diagonal of the black molding layer 120. Accordingly, light emitted from the unit pixel 10 is scattered by the pattern of the elements 110p of the light diffusion layer 110, and light traveling in a lateral direction may be scattered again by the pattern of the elements 120p of the black molding layer 120, and thus, light extraction efficiency may be improved by diffuse reflection. However, the inventive concepts are not limited thereto, and in another exemplary embodiment, the elements 110p of the light diffusion layer 110 and the elements 120p of the black molding layer 120 may overlap with one another in the vertical direction.

The black molding layer 120 may be formed of a film-type material, and may be formed, for example, using a thermosetting resin. However, the inventive concepts are not limited thereto, the black molding layer 120 may be formed by jetting, dispensing, or being applied with a material in a form of a molding solution, or may be formed using an ultraviolet curable resin. The black molding layer 120 may include a base material and a black pigment. The base material may be a thermosetting material, without being limited thereto. The base material may include, for example, at least one of silicone, epoxy, ethylene-vinyl acetate copolymer (EVA), polyvinyl butyral (PVB), and urethane. The black dye may include a black dye such as carbon.

FIGS. 3A through 3E are schematic cross-sectional views illustrating a method of manufacturing a light emitting module according to an exemplary embodiment.

Figure 3A:
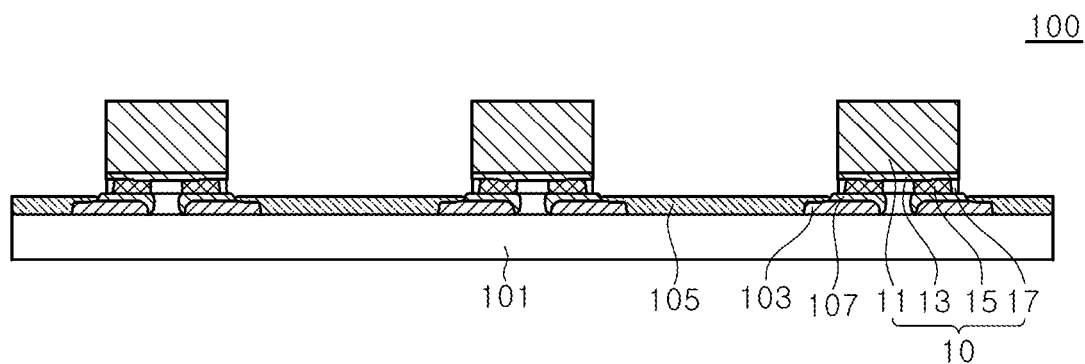
FIGS. 3A through 3E are schematic cross-sectional views illustrating a method of manufacturing a light emitting module according to an exemplary embodiment, where.

Referring to FIG. 3A, a plurality of unit pixels 10 may be mounted on a module substrate 101. The plurality of unit pixels 10 may be disposed on an upper surface of the module substrate 101 so as to be spaced apart from one another at a regular interval. The plurality of unit pixels 10 may be bonded to the module substrate 101 through, for example, a reflow process.

Connection electrodes 15 of the plurality of unit pixels 10 may be connected to pads 103 formed on the module substrate 101 by a bonding agent 107, respectively. However, the inventive concepts are not limited thereto, and for example, the connection electrodes 15 of the plurality of unit pixels 10 may be connected to the pads 103 formed on the module substrate 101 by eutectic bonding, epoxy bonding, or the like.

Figure 3B:
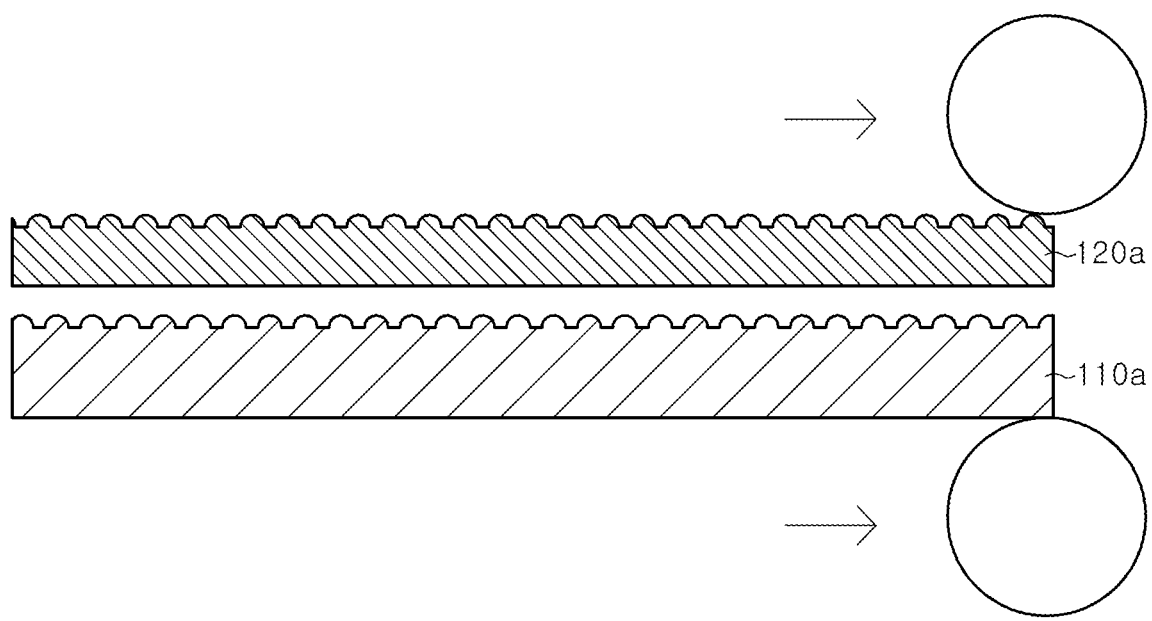

Referring to FIG. 3B, a light diffusion film 110a may be prepared by forming a pattern on an upper surface thereof so as to form a light diffusion layer 110, and a black film 120a may be prepared by forming a pattern on an upper surface thereof so as to form a black molding layer 120. The black film 120a may be disposed on the light diffusion film 110a.

In order to form patterns on the light diffusion film 110a and the black film 120a, after curing each film by applying heat, the patterns may be formed by placing a stamp on each of the light diffusion film 110a and the black film 120a and pressing the stamp. The stamp may be, for example, a metallic material, without being limited thereto, or may be polydimethylsiloxane (PDMS), an elastomer polymer. However, the inventive concepts are not limited thereto, and the patterns may be formed by a method such as nano-imprinting.

Thereafter, each film may be thermally cured for laminating the light diffusion film 110a and the black film 120a, and, for example, heat of about 50° C. may be applied. The light diffusion film 110a and the black film 120a are arranged such that a flat lower surface of the black film 120a is in contact with the patterned upper surface of the light diffusion film 110a, and the light diffusion film 110a and the black film 120a may be laminated by roll lamination in which a roll-to-roll process and a lamination process are combined. When laminating the light diffusion film 110a and the black film 120a, elements 110p of the light diffusion film 110a and elements 120p of the black film 120a are disposed so as not to overlap with one another.

Figure 3C:
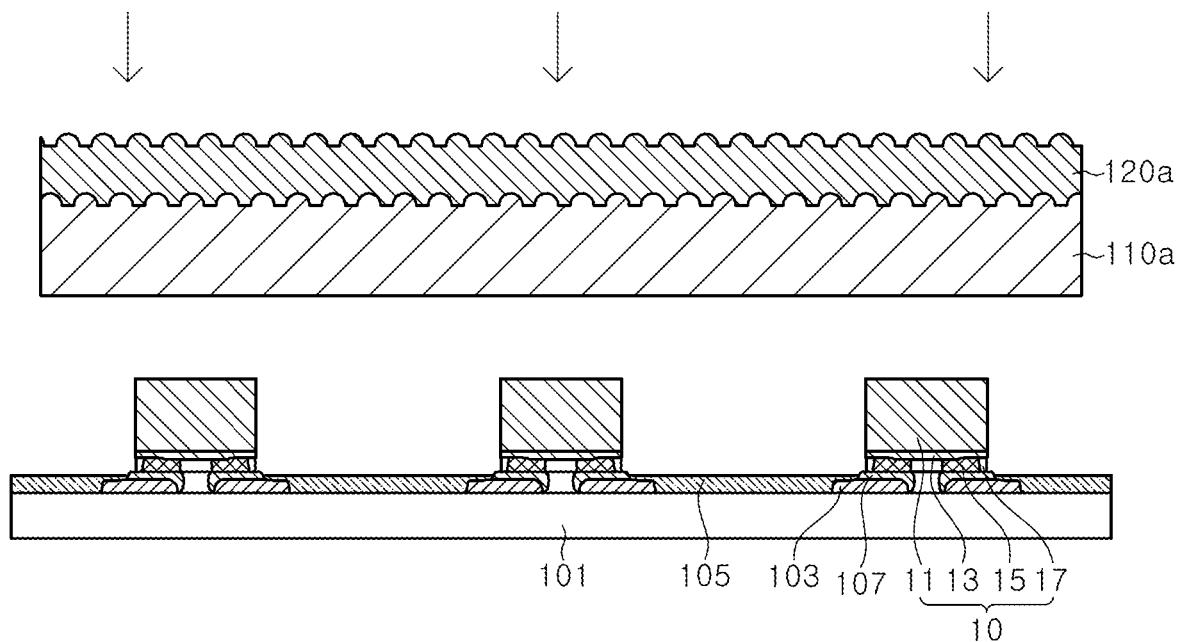
Figure 3D:
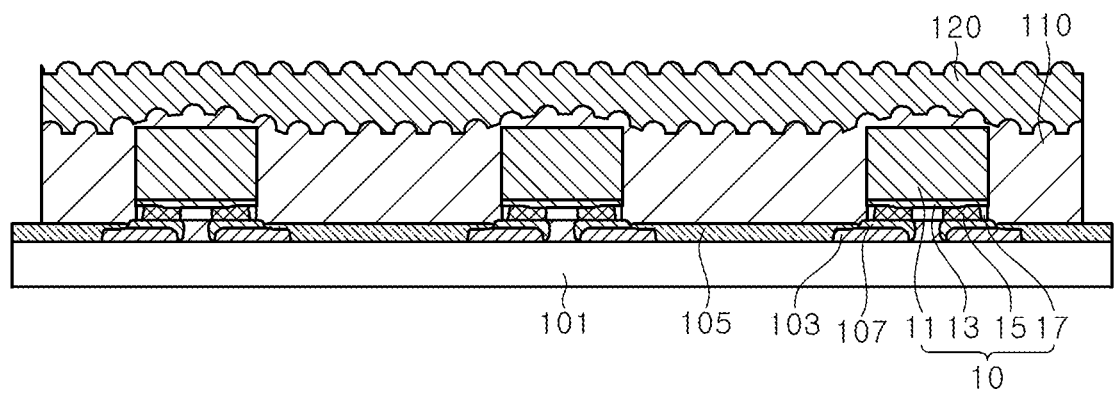

Referring to FIGS. 3C and 3D, the light diffusion layer 110 and the black molding layer 120 may be formed by disposing the laminated light diffusion film 110a and black film 120a on the module substrate 101.

The light diffusion layer 110 and the black molding layer 120 covering the unit pixels 10 may be formed by disposing the laminated light diffusion film 110a and the black film 120a on the module substrate 101 and by a vacuum lamination process in which a high temperature and a high pressure are applied in a vacuum. In the vacuum lamination process, a plate may be placed on the black film 120a, and when a vacuum degree of 1 torr is reached at about 60° C., a pressure of 3 kg/cm$^2$ may be applied to the plate. The pressurization process proceeds when a target vacuum level is reached, and thus, it is possible to prevent bubbles from being formed in the light diffusion layer 110.

Thereafter, the light diffusion layer 110 and the black molding layer 120 are left at about 100° C. for 30 minutes, subsequently, at 150° C. for 60 minutes, and then, the light diffusion layer 110 and the black molding layer 120 may be cured using heat.

Figure 3E:
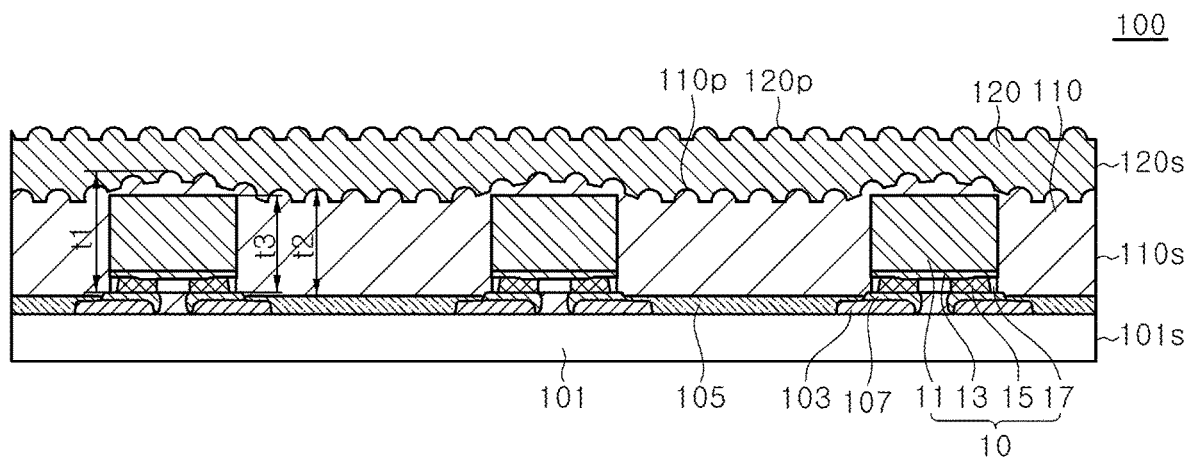

Referring to FIG. 3E, the light emitting module 100 may be completed by cutting edges of the module substrate 101, the light diffusion layer 110, and the black molding layer 120 and removing them. The light diffusion layer 110 and the black molding layer 120 may be cut using techniques such as dicing, laser cutting, or routing. Accordingly, a cut side surface 110a of the light diffusion layer 110 and a cut side surface 120a of the black molding layer 120 may be located on the same plane. In the following exemplary embodiments, differences from the above-described exemplary embodiments will be mainly described so as to avoid redundancy of descriptions, and descriptions of the same elements will be briefly described or omitted.

FIGS. 4A through 4E are schematic cross-sectional views illustrating a method of manufacturing a light emitting module according to another exemplary embodiment.

Referring to FIGS. 4A through 4E, a light emitting module 200 may be formed by the same manufacturing method as that described with reference to FIGS. 3A through 3E, except for a black molding layer 220.

In the illustrated exemplary embodiment, a module substrate 201, pads 203, a black protection layer 205, a bonding agent 207, and unit pixel 20 are identical to the module substrate 101, the pads 103, the black protection layer 105, the bonding agent 107, and the unit pixel 10 of FIGS. 2A through 2C, respectively, and thus, the same descriptions thereof will be omitted. In addition, a substrate 21, a light emitting structure 23, connection electrode 25, and a protection layer 27 are identical to the substrate 11, the light emitting structure 13, the connection electrode 15, and the protection layer 17 of FIGS. 2A through 2C, respectively, and thus, the same descriptions thereof will be omitted.

Figure 4A:
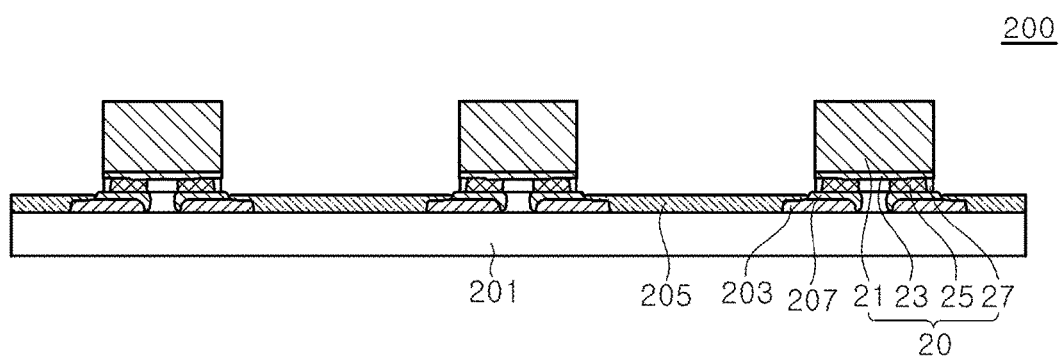
FIGS. 4A through 4E are schematic cross-sectional views illustrating a method of manufacturing a light emitting module according to another exemplary embodiment, where.
Figure 4B:
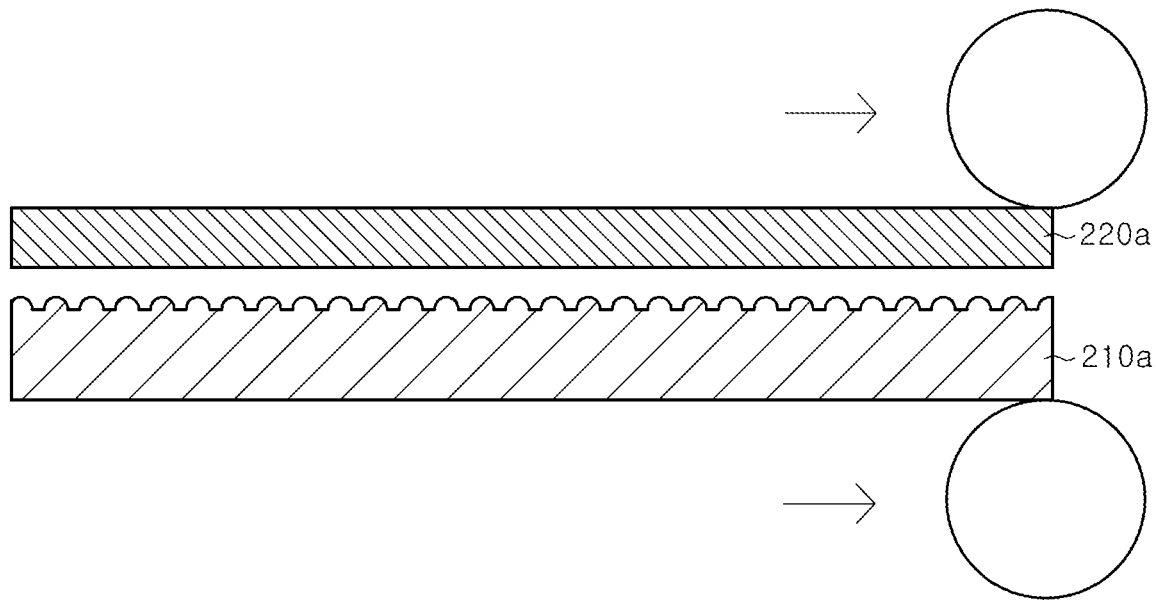
Figure 4C:
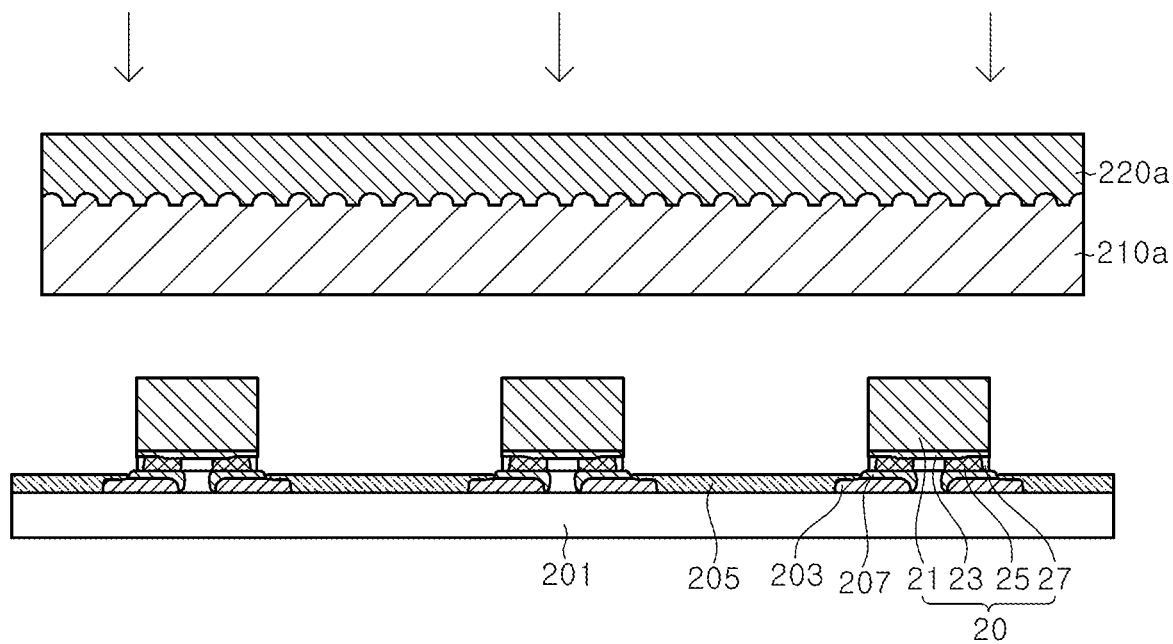
Figure 4D:
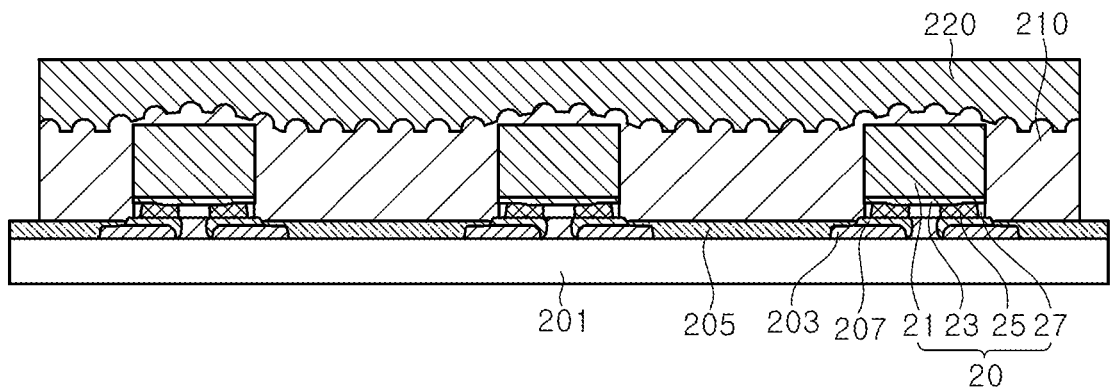
Figure 4E:
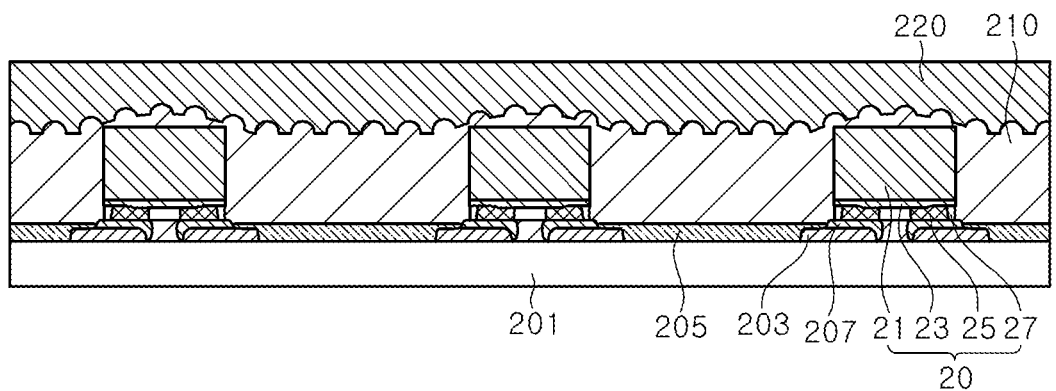

Referring to FIG. 4B, a light diffusion film 210a may be prepared by forming a pattern on an upper surface thereof so as to form a light diffusion layer 210, and a black film 220a may be disposed on the light diffusion layer 210 with flat upper and lower surfaces, so as to form a black molding layer 220. Thereafter, as shown in FIG. 4B, the light diffusion film 210a and the black film 220a may be laminated together by roll lamination in which a roll-to-roll process and a lamination process are combined, while a flat lower surface of the black film 220a is in contact with a patterned upper surface of the light diffusion film 210a, and the light diffusion layer 210 and the black molding layer 220 may be formed using the laminated light diffusion film 210a and the black film 220a, as shown in FIG. 4C. A light emitting module as shown in FIG. 4E may be fabricated by cutting the module substrate 201, the light diffusion layer 210, and the black molding layer 220 which is shown in FIG. 4D. According to the illustrated exemplary embodiment, as shown in FIG. 4E, an upper surface of the black molding layer 220 may be flat.

FIGS. 5A through 5E are schematic cross-sectional views illustrating a method of manufacturing a light emitting module according to another exemplary embodiment.

Referring to FIGS. 5A through 5E, a light emitting module 300 may be formed by the same manufacturing method as that described with reference to FIGS. 3A through 3E, except for a light diffusion layer 310.

In the illustrated exemplary embodiment, a module substrate 301, pads 303, a black protection layer 305, a bonding agent 307, and unit pixel 30 are identical to the module substrate 101, the pads 103, the black protection layer 105, the bonding agent 107, and the unit pixel 10 of FIGS. 2A through 2C, respectively, and thus, the same descriptions thereof will be omitted. In addition, a substrate 31, a light emitting structure 33, connection electrode 35, and a protection layer 37 are identical to the substrate 11, the light emitting structure 13, the connection electrode 15, and the protection layer 17 of FIGS. 2A through 2C, respectively, and thus, the same descriptions thereof will be omitted.

Figure 5A:
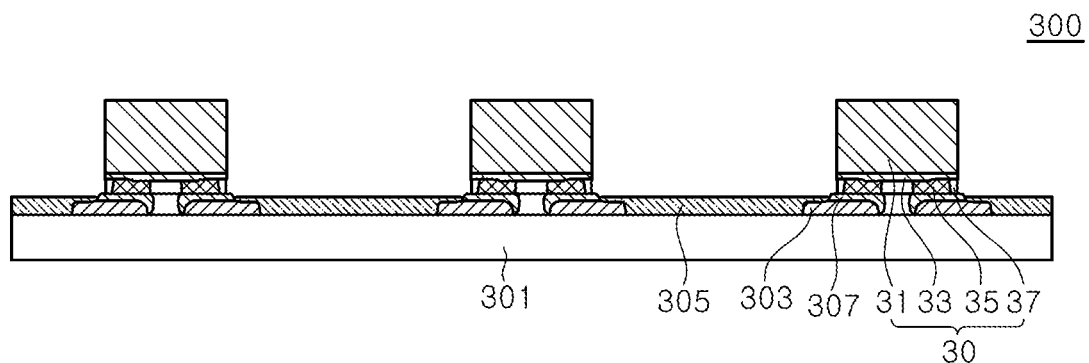
FIGS. 5A through 5E are schematic cross-sectional views illustrating a method of manufacturing a light emitting module according to another exemplary embodiment, where.
Figure 5B:
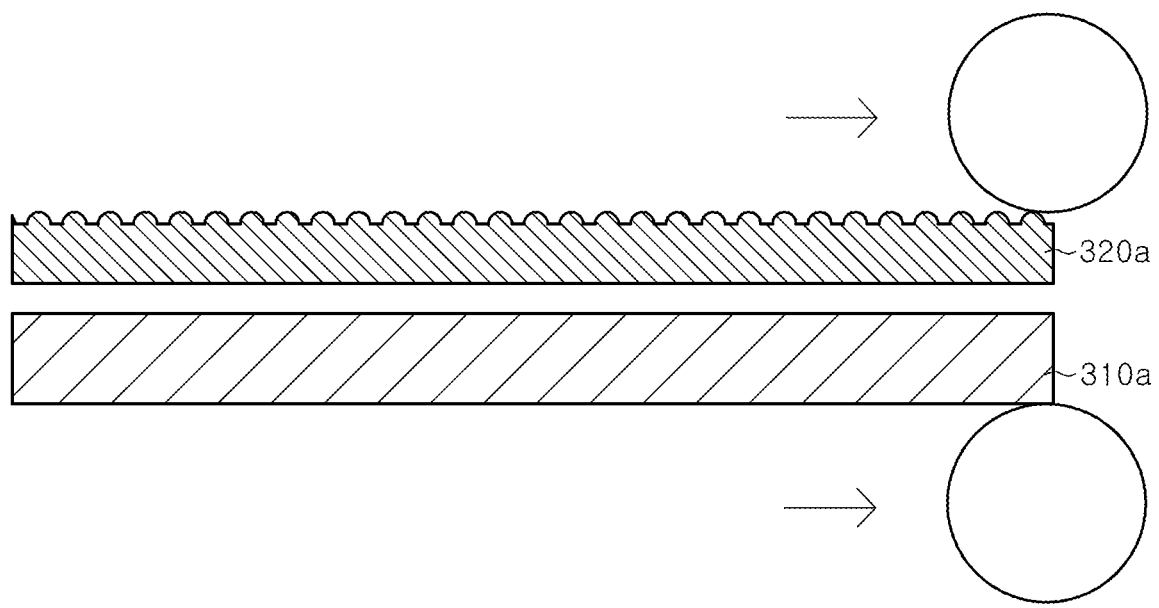
Figure 5C:
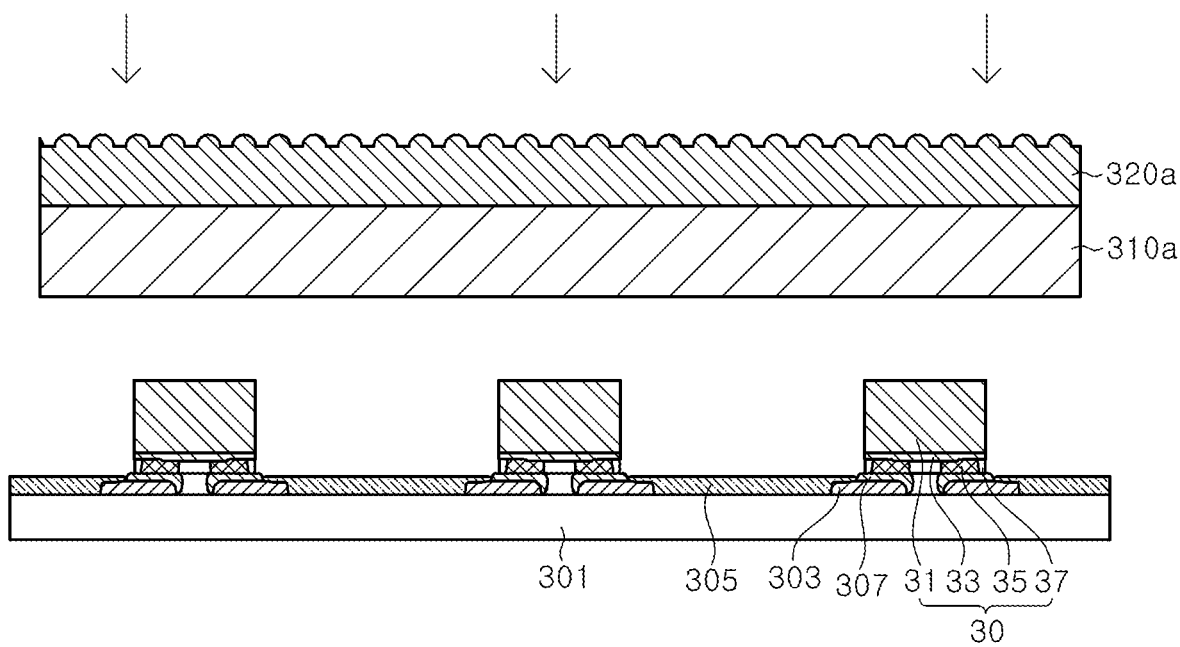
Figure 5D:
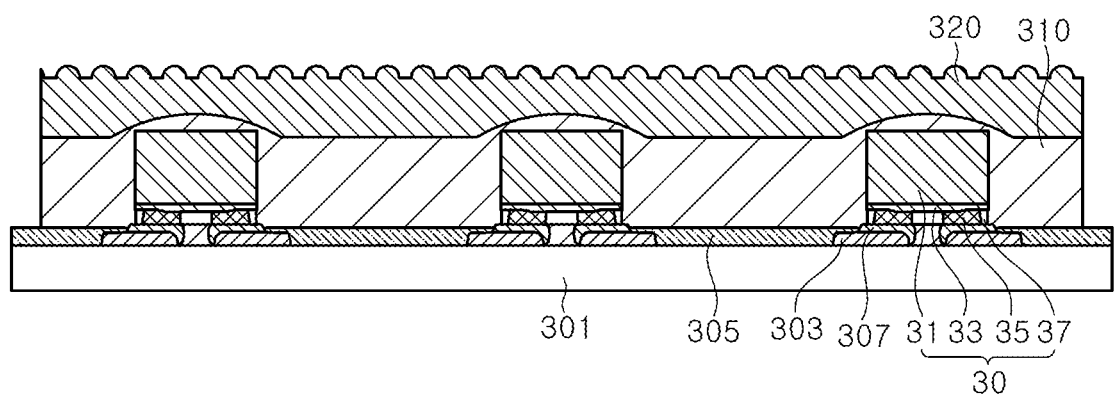
Figure 5E:
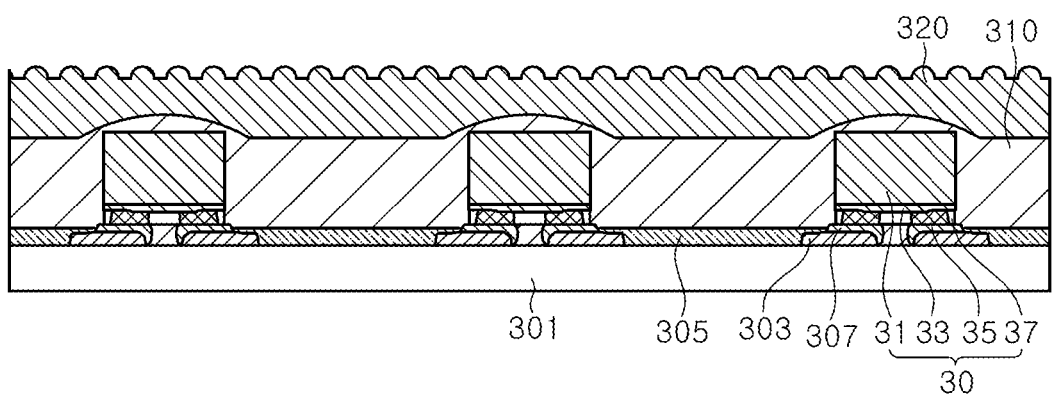

Referring to FIG. 5B, a light diffusion film 310a may be prepared with flat upper and lower surfaces so as to form the light diffusion layer 310, and a black film 320a may be prepared by forming a pattern on an upper surface thereof so as to form a black molding layer 320. The light diffusion layer 310 and the black molding layer 320 may be laminated by disposing the black film 320a on the light diffusion film 310a, and by laminating them by roll lamination in which a roll-to-roll process and a lamination process are combined as shown in FIG. 5B, while the flat lower surface of the black film 320a is in contact with the flat upper surface of the light diffusion film 310a as shown in FIG. 5C, and the light diffusion layer 310 and the black molding layer 320 as shown in FIG. 5D may be formed using the laminated light diffusion film 310a and black film 320a. A light emitting module as shown in FIG. 5E may be manufactured by cutting the module substrate 301, the light diffusion layer 310, and the black molding layer 320 which are shown in FIG. 5D. An upper surface of the black molding layer 320 may be in a patterned form.

Meanwhile, when the light diffusion layer 310 and the black molding layer 320 covering the unit pixels 30 are formed by the lamination process, in particular, a vacuum lamination process, the light diffusion layer 310 disposed over the unit pixel 30 may have a convex shape, as shown in FIG. 5D. The upper surface of the black molding layer 320 may have generally a flat surface, and thus, a thickness of the black molding layer 320 disposed over the unit pixels 30 may be smaller than that of the black molding layer disposed between the unit pixels 30.

Figure 6A:
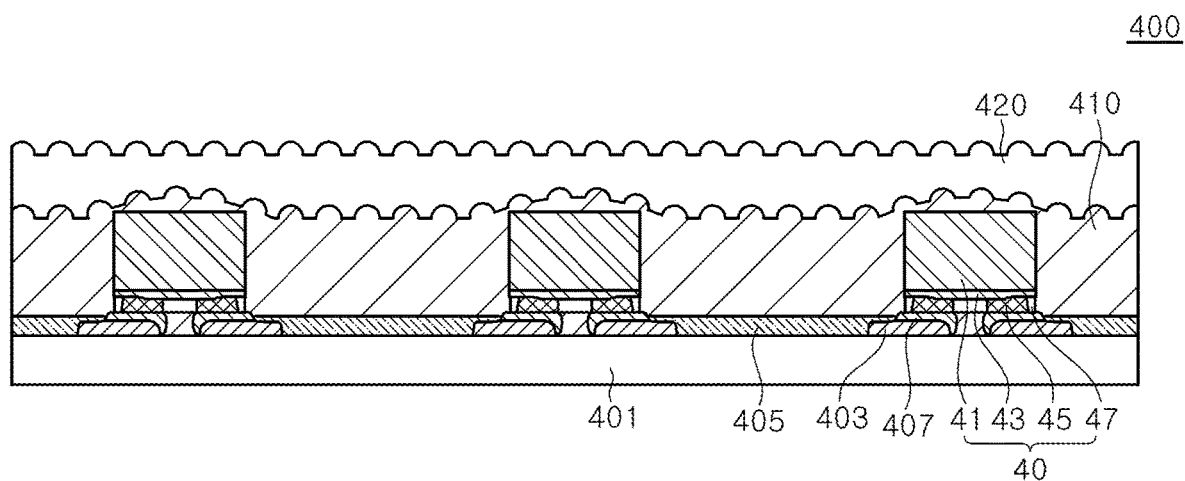
FIG. 6A is a cross-sectional view illustrating a method of manufacturing a light emitting module according to another exemplary embodiment.
Figure 6B:
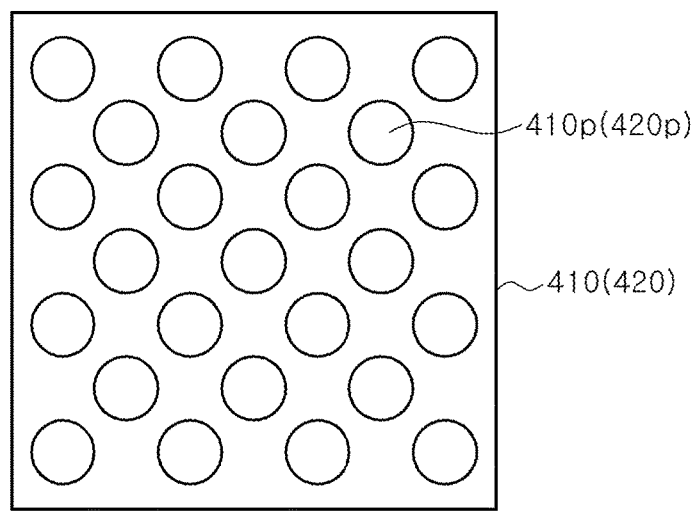
FIG. 6B is a schematic plan view of FIG. 6A.

FIGS. 6A and 6B are schematic plan view and cross-sectional view illustrating a method of manufacturing a light emitting module according to another exemplary embodiment.

Referring to FIGS. 6A and 6B, a light emitting module 400 may be formed by the same manufacturing method as that described with reference to FIGS. 3A through 3E, except for an arrangement between elements 410p and 420p of patterns located on upper surfaces of a light diffusion layer 410 and a black molding layer 420.

In the illustrated exemplary embodiment, a module substrate 401, pads 403, a black protection layer 405, a bonding agent 407, and unit pixel 40 are identical to the module substrate 101, the pads 103, the black protection layer 105, the bonding agent 107, and the unit pixel 10 of FIGS. 2A through 2C, respectively, and thus, the same descriptions thereof will be omitted. In addition, a substrate 41, a light emitting structure 43, connection electrode 45, and a protection layer 47 are identical to the substrate 11, the light emitting structure 13, the connection electrode 15, and the protection layer 17 of FIGS. 2A through 2C, respectively, and thus, the same descriptions thereof will be omitted.

When a light diffusion film and a black film are laminated so as to form the light diffusion layer 410 and the black molding layer 420, the elements of the pattern on the light diffusion film and the elements of the pattern on the black film may be arranged so as to overlap with one another. Accordingly, the elements of the pattern of the light diffusion layer 410 and the elements of the pattern of the black molding layer 420 may overlap with one another. As shown in FIG. 6B, the elements 410p of the pattern of the light diffusion layer 410 and the elements 420p of the pattern of the black molding layer 420 may be formed to overlap with one another.

Accordingly, as light emitted from the unit pixel 40 is scattered by the pattern of the light diffusion layer 410, and scattered light passes through the pattern of the black molding layer 420 to generate additional light scattering, it is possible to improve a visual image by alleviating a color tone change by removing an optical distortion of the display apparatus. In addition, a path of light may be changed due to the scattering of light, and the changed path may be extracted to the outside to improve light extraction efficiency.

FIGS. 7A through 7G are schematic cross-sectional views illustrating a method of manufacturing a light emitting module according to another exemplary embodiment.

Referring to FIGS. 7A through 7G, the method of manufacturing a light emitting module is substantially identical to that described with reference to FIGS. 3A through 3E, but an order of processes of the manufacturing method may be different.

In the illustrated exemplary embodiment, a module substrate 501, pads 503, a black protection layer 505, a bonding agent 507, and unit pixel 50 are identical to the module substrate 101, the pads 103, the black protection layer 105, the bonding agent 107, and the unit pixel 10 of FIGS. 2A through 2C, respectively, and thus, the same descriptions thereof will be omitted. In addition, a substrate 51, a light emitting structure 53, connection electrode 55, and a protection layer 57 are identical to the substrate 11, the light emitting structure 13, the connection electrode 15, and the protection layer 17 of FIGS. 2A through 2C, respectively, and thus, the same descriptions thereof will be omitted.

Figure 7A:
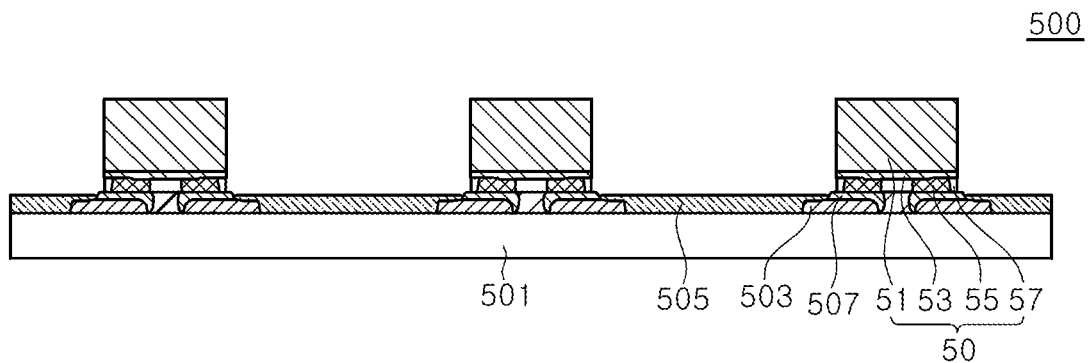
FIGS. 7A through 7G are schematic cross-sectional views illustrating a method of manufacturing a light emitting module according to another exemplary embodiment, where.

Referring to FIG. 7A, a plurality of unit pixels 50 may be mounted on a module substrate 501. A description of mounting the plurality of unit pixels 50 is identical to that described with reference to FIG. 3A, and thus, it will be omitted.

Figure 7B:
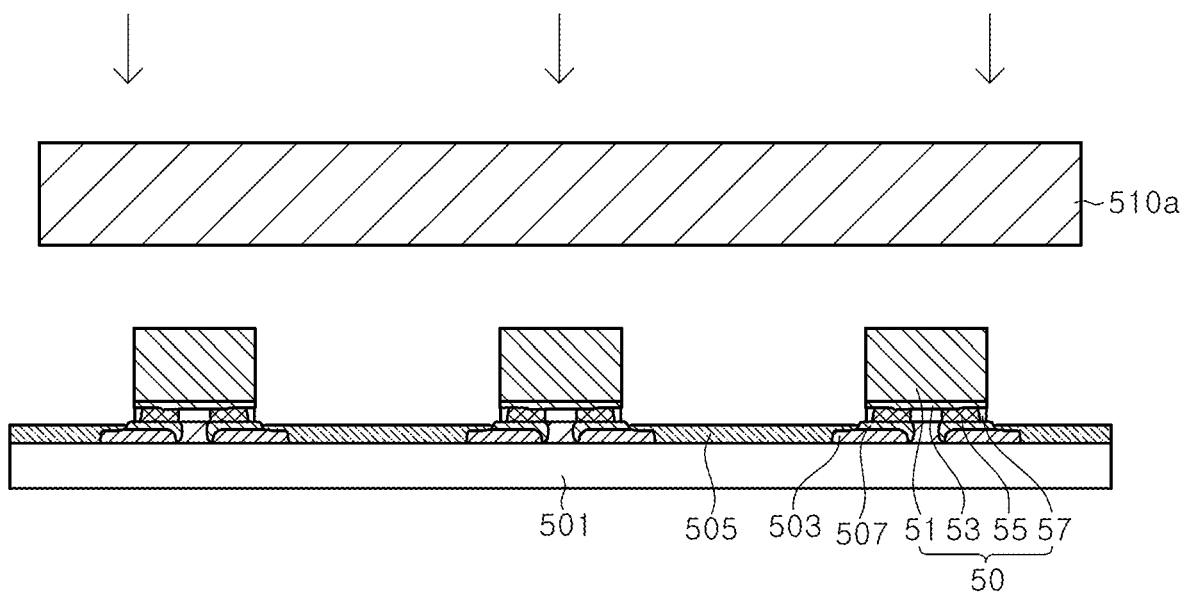
Figure 7C:
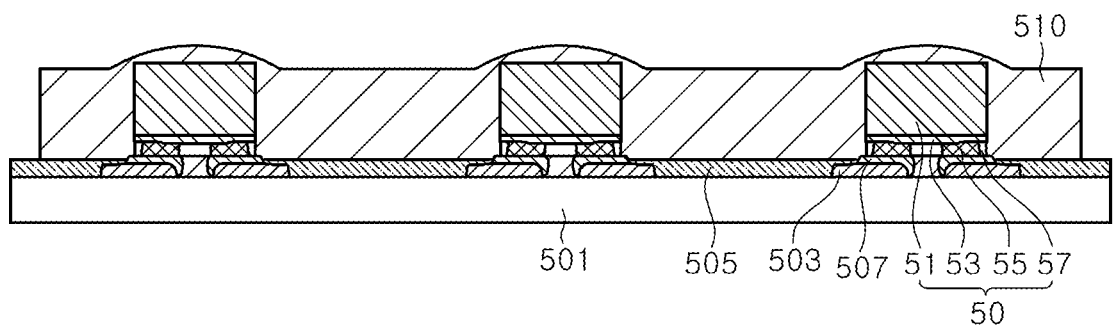

Referring to FIG. 7B, a light diffusion film 510a may be disposed on the plurality of unit pixels 50 so as to form a light diffusion layer 510 as shown in FIG. 7C. A description of forming the light diffusion layer 510 on the module substrate 501 is identical to that described with reference to FIG. 3C, and thus it will be omitted. However, in the illustrated exemplary embodiment, the light diffusion layer 510 is formed by vacuum laminating the light diffusion film 510a alone on the module substrate 501 without laminating the light diffusion film 510a and the black film.

Referring to FIG. 7C, the light diffusion layer 510 may be formed on the module substrate 501 so as to cover lower surfaces, side surfaces, and upper surfaces of the plurality of unit pixels 50. An upper surface of the light diffusion layer 510 may include a convex portion over the unit pixel 50. The convex portion may be formed while being pressed when the light diffusion layer 510 is disposed on the module substrate 501 by vacuum lamination. However, the inventive concepts are not limited thereto, and when a thickness of the light diffusion layer 510 is sufficiently larger than a thickness of the unit pixel 50, the light diffusion layer 510a may form a substantially flat upper surface without the convex portion. For example, the thickness of the unit pixel 50 may be about 10 µm to about 200 µm, and the thickness of the light diffusion layer 510 may be identical to or greater than the thickness of the unit pixel 50. For example, the thickness of the unit pixel 50 may be about 170 µm, and the thickness of the light diffusion layer 510 may be 170 µm to 200 µm, without being limited thereto.

Figure 7D:
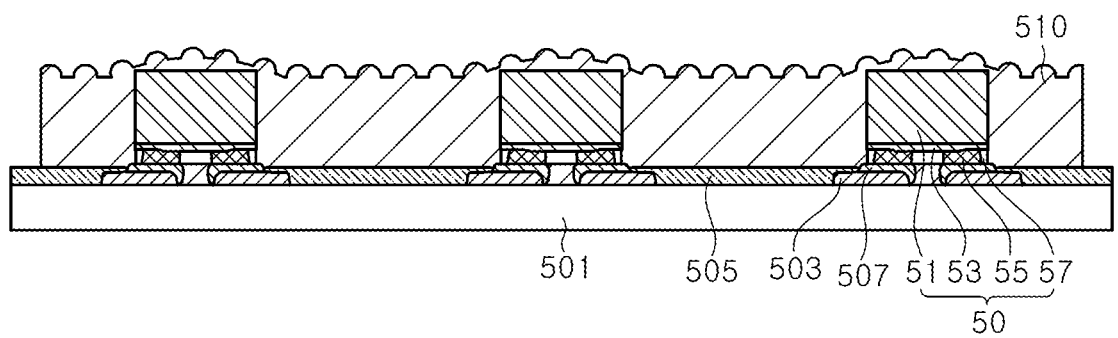

Referring to FIG. 7D, a pattern may be formed on an upper surface of the light diffusion layer 510. A description of forming the pattern on the upper surface of the light diffusion layer 510 is provided with reference to FIG. 3B. Thereafter, a thermally curing process is performed, which is identical to that described with reference to FIG. 3D.

Figure 7E:
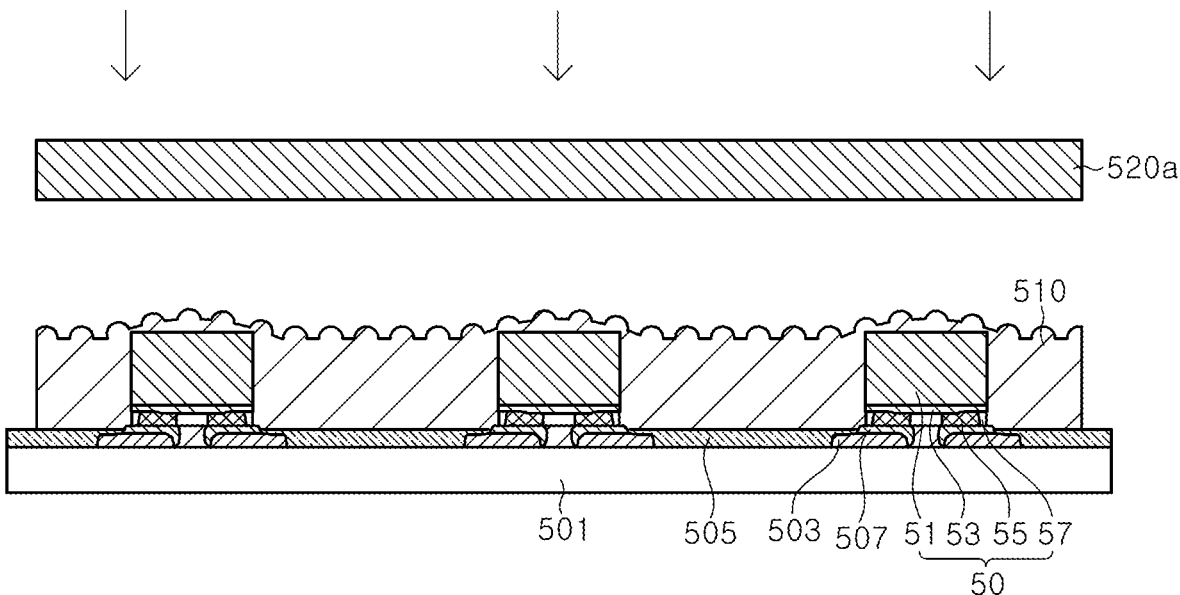

Referring to FIG. 7E, a black molding layer 520 may be formed on the light diffusion layer 510 using a black film 520a. The black molding layer 520 may be formed on the light diffusion layer 510 by a vacuum lamination process using the black film 520a, and a description thereof is described with reference to FIG. 3C.

Figure 7F:
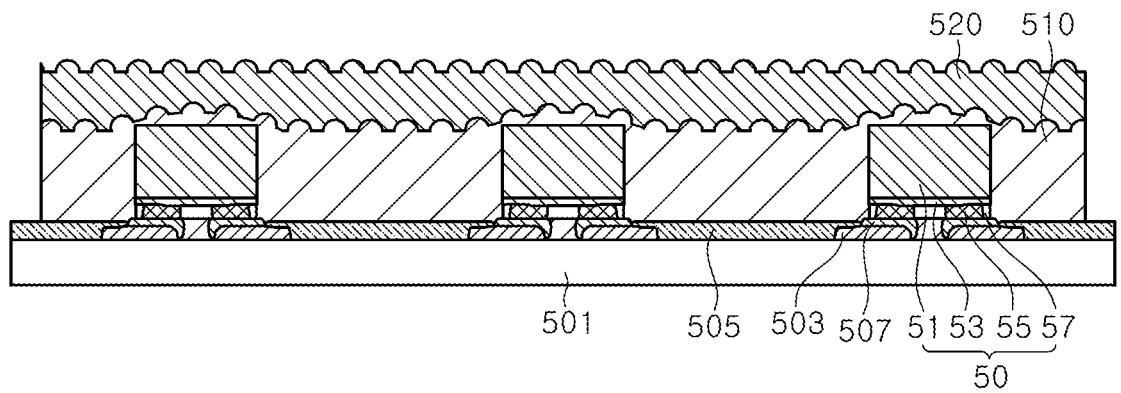

Referring to FIG. 7F, a pattern may be formed on an upper surface of the black molding layer 520. As a description of forming the pattern on the upper surface of the black molding layer 520 is identical to that described with reference to FIG. 3B, it will be omitted.

Figure 7G:
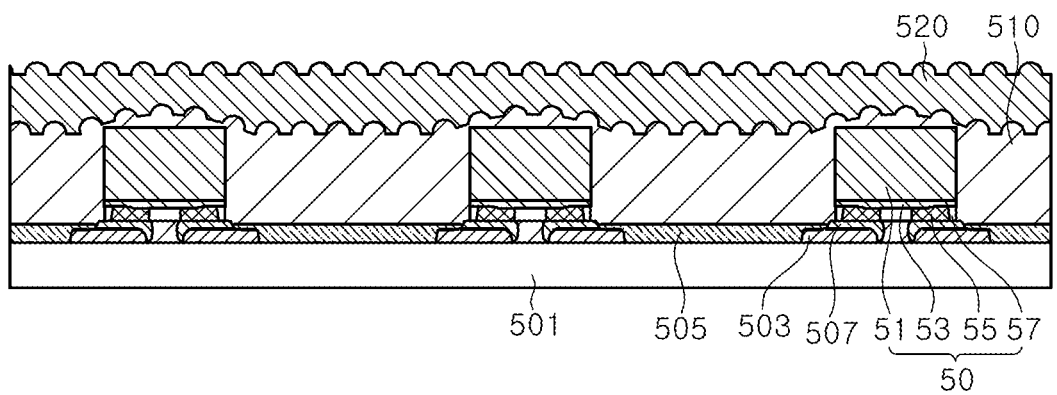

Referring to FIG. 7G, a light emitting module 500 may be completed by cutting edges of the module substrate 501, the light diffusion layer 510, and the black molding layer 520 and removing them.

FIGS. 8A through 8F are schematic cross-sectional views illustrating a method of manufacturing a light emitting module according to an exemplary embodiment.

Referring to FIGS. 8A through 8F, the method of manufacturing a light emitting module is substantially identical to that described with reference to FIGS. 3A through 3E, except that a light diffusion layer 610 is formed in a plurality of layers.

In the illustrated exemplary embodiment, a module substrate 601, pads 603, a black protection layer 605, a bonding agent 607, and a unit pixel 60 are identical to the module substrate 101, the pads 103, the black protection layer 105, the bonding agent 107, and the unit pixel 10 of FIGS. 2A through 2C, respectively, and thus, the same descriptions thereof will be omitted. In addition, a substrate 61, a light emitting structure 63, connection electrode 65, and a protection layer 67 are identical to the substrate 11, the light emitting structure 13, the connection electrode 15, and the protection layer 17 of FIGS. 2A through 2C, respectively, and thus, same descriptions thereof will be omitted.

Figure 8A:
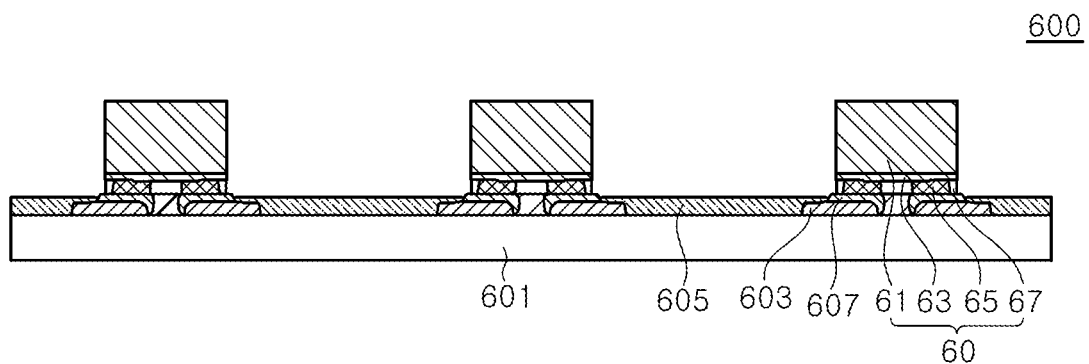
FIGS. 8A through 8F are schematic cross-sectional views illustrating a method of manufacturing a light emitting module according to an exemplary embodiment, where.

Referring to FIG. 8A, a plurality of unit pixels 60 may be mounted on a module substrate 601. A description of mounting the plurality of unit pixels 60 is identical to that described with reference to FIG. 3A, and thus, it will be omitted.

Figure 8B:
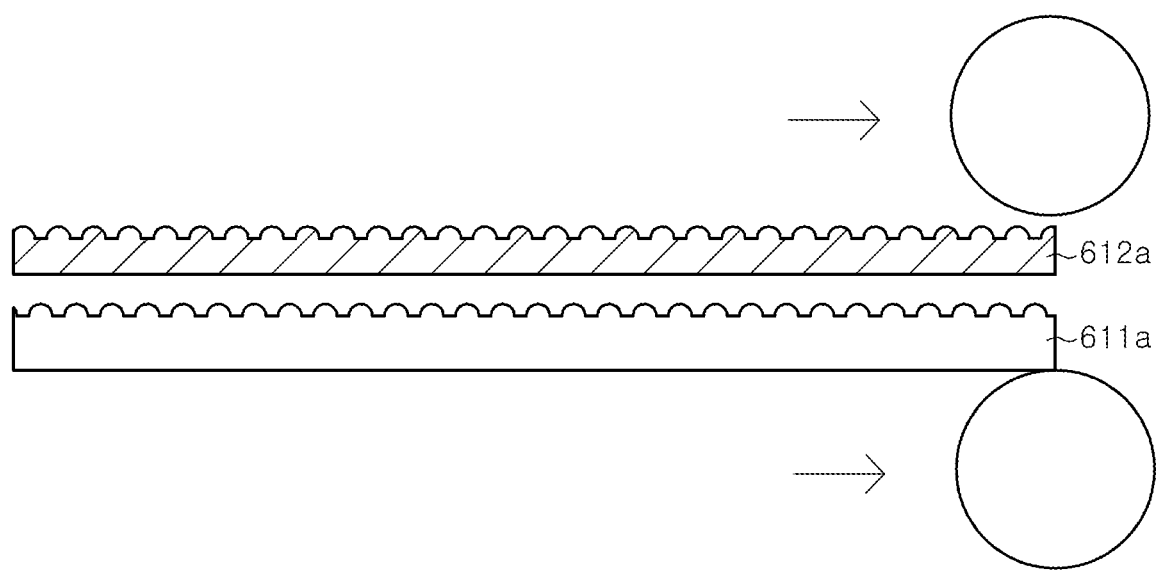
Figure 8C:
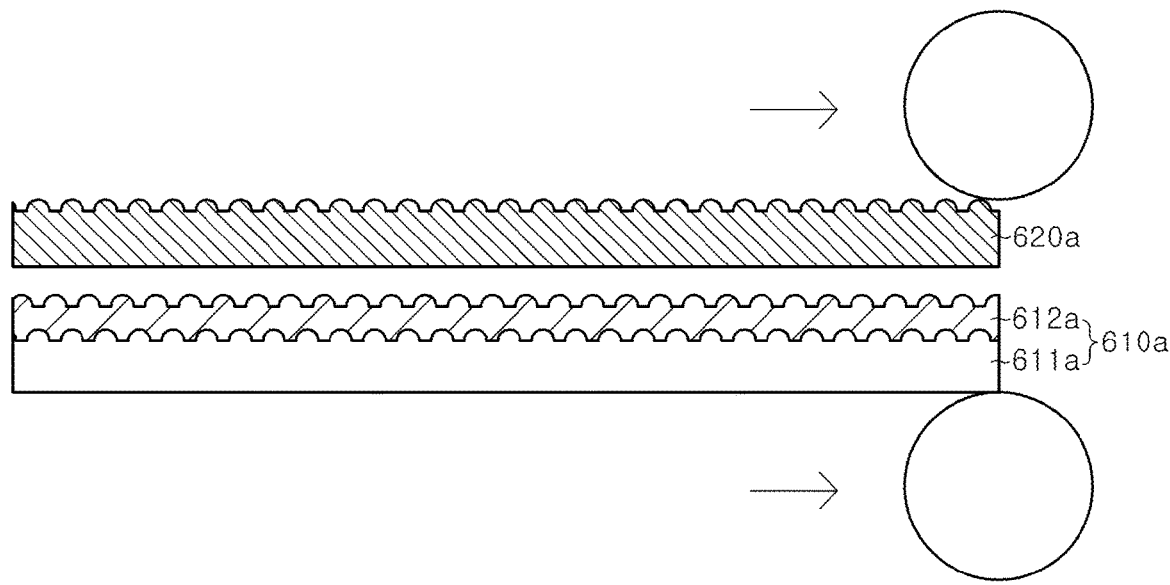

Referring to FIGS. 8B and 8C, the method of manufacturing the light emitting module is similar to that described with reference to FIG. 3B, but the method includes an additional step of forming a light diffusion film 610a by laminating a plurality of films 611a and 612a.

The light diffusion film 610a may be formed of, for example, a first light diffusion film 611a and a second light diffusion film 612a, as shown in FIG. 8B. A pattern may be formed on at least one of an upper surface of the first light diffusion film 611a and an upper surface of the second light diffusion film 612a. In an exemplary embodiment, a pattern may be formed on the upper surface of the first light diffusion film 611a and the upper surface of the second light diffusion film 612a, respectively. The description of forming the pattern is identical to that described with reference to FIG. 3B, and thus, it will be omitted.

Both the first light diffusion film 611a and the second light diffusion film 612a may be films that diffuse light, without being limited thereto, or one of them may be a transparent film. For example, the first light diffusion film 611a may be a transparent film, the second light diffusion film 612a may be a light diffusion film, and a black film 620a may be a black film. As a first light diffusion layer 611 is further disposed by the first light diffusion film 611a, the plurality of unit pixels 60 may be protected without optical distortion. In addition, as a second light diffusion layer 612 may be formed to be relatively thin, light loss due to light absorption by the second light diffusion layer 612 may be reduced.

In the exemplary embodiment of the present disclosure, the first light diffusion film 611a may be a transparent film, and the second light diffusion film 612a may be a diffusion film, without being limited thereto. For example, the first light diffusion film 611a may be formed of a diffusion film, the second light diffusion film 612a may be a transparent film, or both the first and second light diffusion films 611a and 612a may be diffusion films. When both the first and second light diffusion films 611a and 612a are the diffusion films, a density, a size, a thickness, a material, and others of a diffusion agent in the first and second light diffusion films 611a and 612a may be different from one another.

The pattern of the first light diffusion film 611a and the pattern of the second light diffusion film 612a may be laminated so as not to overlap with each other. For example, similar to that described with reference to FIG. 2D, a center of elements of the pattern of the first light diffusion film 611a may be located on the same axis as a point at which straight lines connecting centers of elements of the pattern of the second light diffusion film 612a intersect. In addition, the center of the elements of the second light diffusion film 612a may be located on the same axis as a point at which straight lines connecting the centers of the elements of the pattern of the black film 620a intersect. In an exemplary embodiment, the elements of the pattern of the first light diffusion film 611a and the elements of the pattern of the black film 620a may overlap one another, and thus, the center of the elements of the pattern of the first light diffusion film 611a may be located on the same axis as the center of the elements of the pattern of the black film 620a. However, the inventive concepts are not limited thereto, the patterns of the first light diffusion film 611a, the second light diffusion film 612a, and the black film 620a may all overlap, and the centers of the elements of the films 611a, 612a, and 620a may all be located on the same axis. In another exemplary embodiment, the center of the elements of at least one of the first light diffusion film 611a, the second light diffusion film 612a, and the black film 620a may not overlap with the centers of the elements of the other films.

Figure 8D:
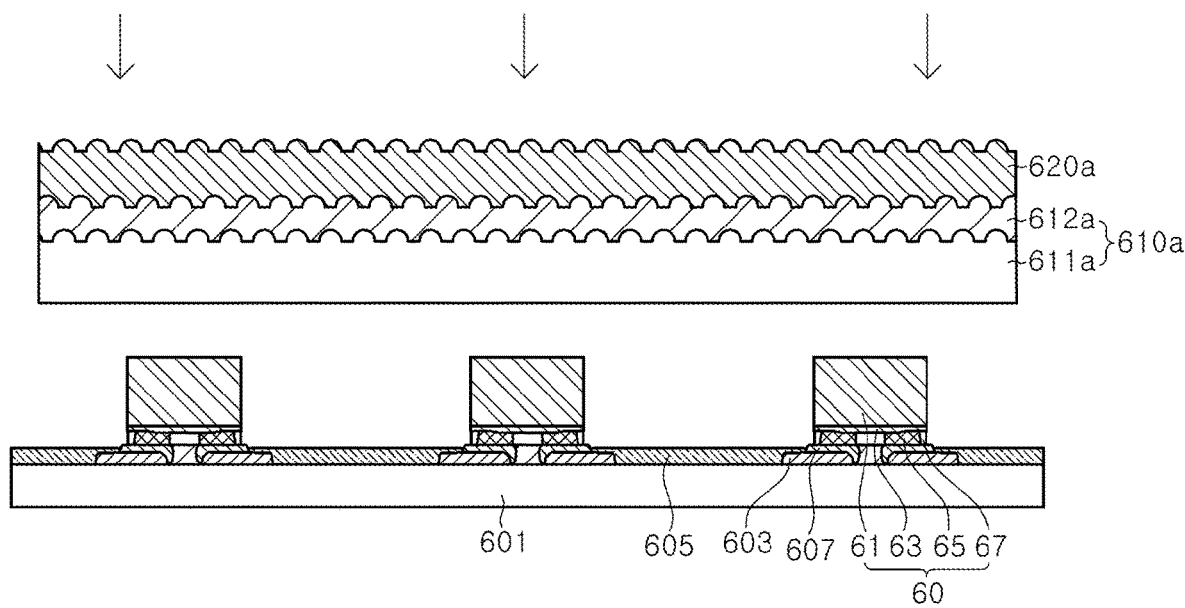
Figure 8E:
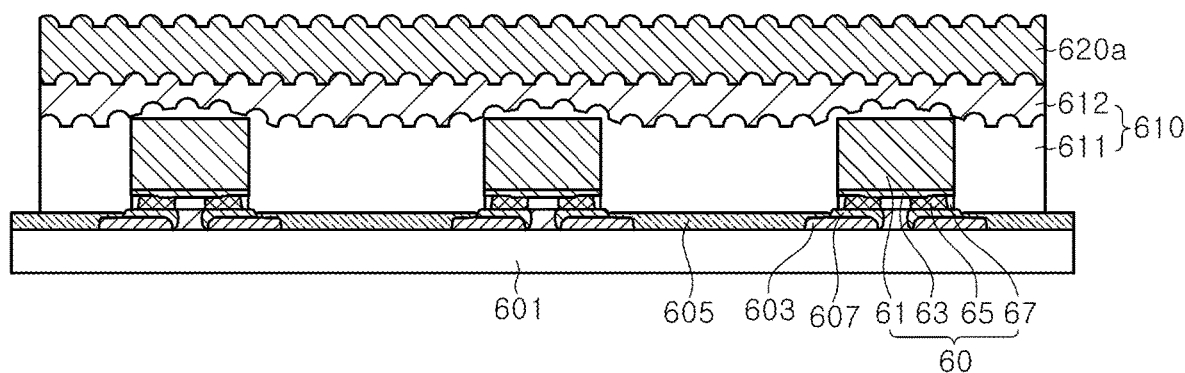

Referring to FIGS. 8D and 8E, a first light diffusion layer 611, a second light diffusion layer 612, and a black molding layer 620 covering the unit pixels 60 may be formed on the module substrate 601. A description of forming the first light diffusion layer 611, the second light diffusion layer 612, and the black molding layer 620 is identical to that described with reference to FIG. 3C, and thus, it will be omitted.

The first and the second light diffusion layers 611 and 612 and the black molding layer 620 may be thermally cured on the module substrate 601. As a description of the thermally curing step is identical to that described with reference to FIG. 3D, it will be omitted.

Figure 8F:
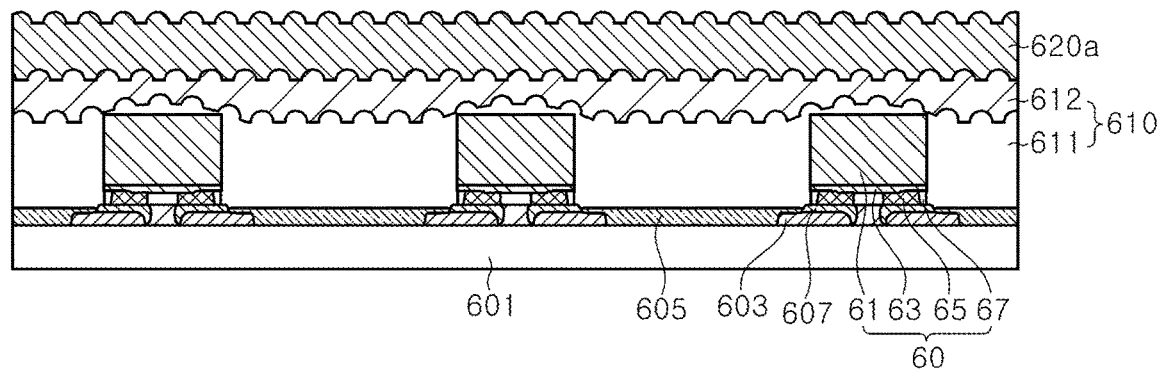

Referring to FIG. 8F, a light emitting module 600 is completed by cutting edges of the module substrate 601, the first and second light diffusion layers 611 and 612, and the black molding layer 620 and removing them.

In the above exemplary embodiments, the unit pixels 10, 20, 30, 40, 50, and 60 have been described as including the first through third LED stacks stacked vertically, but the present disclosure is not limited to those unit pixels. For example, the unit pixel may have a structure in which the first through third light emitting devices are arranged in a lateral direction. Hereinafter, an exemplary embodiment having a structure in which first through third light emitting devices are arranged in the lateral direction will be described with reference to the drawings.

Figure 9A:
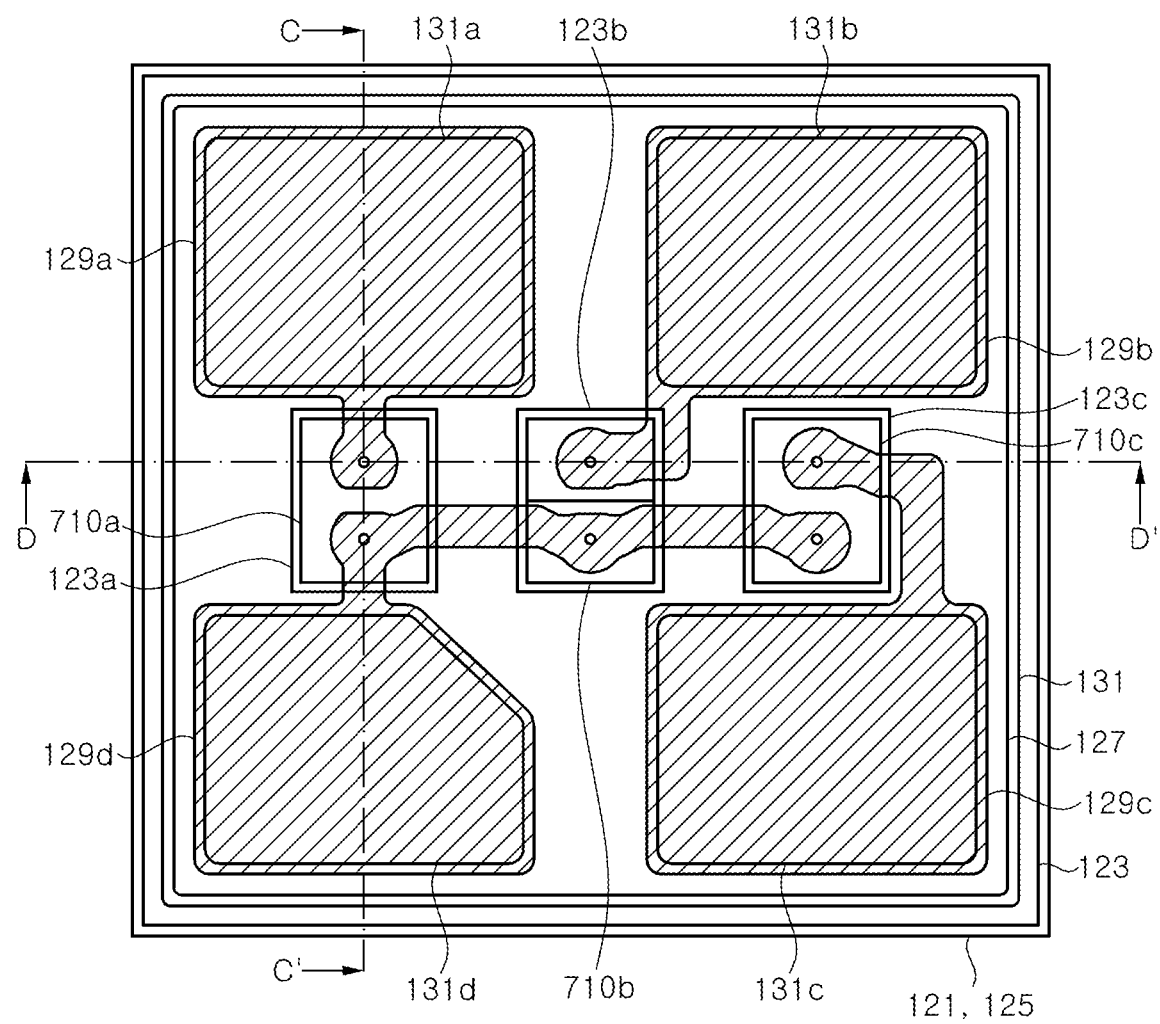
FIG. 9A is a schematic plan view illustrating a unit pixel according to another exemplary embodiment.
Figure 9B:
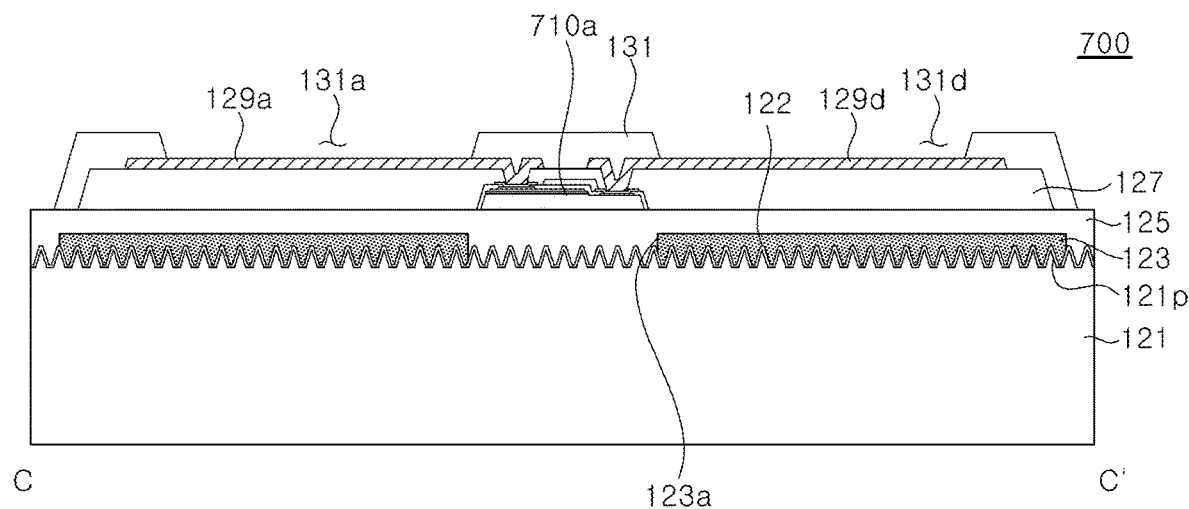
FIG. 9B is a schematic cross-sectional view taken along line C-C' of FIG. 9A.
Figure 9C:
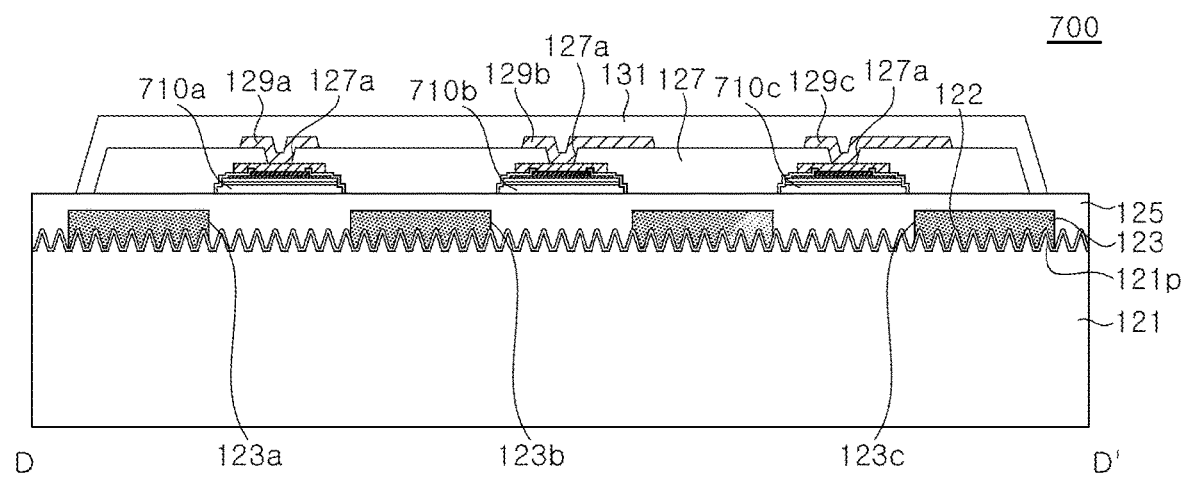
FIG. 9C is a schematic cross-sectional view taken along line D-D' of FIG. 9A.

FIG. 9A is a schematic plan view illustrating a unit pixel 700 according to another exemplary embodiment, FIG. 9B is a schematic cross-sectional view taken along line C-C' of FIG. 9A, and FIG. 9C is a schematic cross-sectional view taken along line D-D' of FIG. 9A.

Referring to FIGS. 9A, 9B, and 9C, the unit pixel 700 may include a transparent substrate 121, first through third light emitting devices 710a, 710b, and 710c, a surface layer 122, a light locking layer 123, an adhesive layer 125, a step adjustment layer 127, connection layers 129a, 129b, 129c, and 129d, and an insulation material layer 131.

The unit pixel 700 provides one pixel including the first through the third light emitting devices 710a, 710b, and 710c. The first through third light emitting devices 710a, 710b, and 710c emit light having different colors from one another, and they respectively correspond to sub-pixels.

The transparent substrate 121 is a light-transmitting substrate such as PET, a glass substrate, a quartz substrate, or a sapphire substrate. The transparent substrate 121 is disposed on a light exiting surface of the display apparatus (1000 of FIG. 1), and light emitted from the light emitting devices 710a, 710b, and 710c is emitted to the outside through the transparent substrate 121. The transparent substrate 121 may have an upper surface and a lower surface. The transparent substrate 121 may include a concave-convex pattern 121p on a surface opposite to the light emitting devices 710a, 710b, and 710c, that is, the upper surface. The concave-convex pattern 121p scatters light emitted from the light emitting devices 710a, 710b, and 710c to increase a viewing angle. In addition, light emitted from the light emitting devices 710a, 710b, and 710c having different viewing angle characteristics may be emitted with a uniform viewing angle by the concavo-convex pattern 121p. Accordingly, it is possible to prevent a color change from occurring depending on the viewing angle.

The concave-convex pattern 121p may be regular or irregular. In some forms, the concave-convex pattern 121p may have, for example, a pitch of 3 μm, a diameter of 2.8 μm, and a height of 1.8 μm. The concave-convex pattern 121p may be a pattern that is generally applied to a patterned sapphire substrate, without being limited thereto.

The transparent substrate 121 may also include an anti-reflection coating, may include an anti-glare layer, or may be treated with an anti-glare treatment. The transparent substrate 121 may have a thickness of, for example, 50 μm to 300 μm.

As the transparent substrate 121 is disposed on the light exiting surface, the transparent substrate 121 does not include a circuit. However, the inventive concepts are not limited thereto, and may include a circuit.

Meanwhile, although it is illustrated that one unit pixel 700 is formed on one transparent substrate 121, a plurality of unit pixels 700 may be formed on one transparent substrate 121.

The surface layer 122 covers the concave-convex pattern 121p of the transparent substrate 121. The surface layer 122 may be formed along a shape of the concave-convex pattern 121p. The surface layer 122 may improve adhesion of the light blocking layer 123 formed thereon. For example, the surface layer 122 may be formed of a silicon oxide film. The surface layer 122 may be omitted depending on a type of the transparent substrate 121.

The light blocking layer 123 is formed on the upper surface of the transparent substrate 121. The light blocking layer 123 may be in contact with the surface layer 122. The light blocking layer 123 may include an absorbing material that absorbs light, such as carbon black. The light absorbing material prevents light generated in the light emitting devices 710a, 710b, and 710c from leaking to a side in a region between the transparent substrate 121 and the light emitting devices 710a, 710b, and 710c, and improves a contrast of the display apparatus.

The light blocking layer 123 may have windows 123a, 123b, and 123c for a light path such that light generated in the light emitting devices 710a, 710b, and 710c is incident on the transparent substrate 121, and for this purpose, the light blocking layer 123 may be patterned on the transparent substrate 121 so as to expose the transparent substrate 121. Widths of the windows 123a, 123b, and 123c may be smaller than those of the light emitting devices, without being limited thereto. For example, the widths of the windows 123a, 123b, and 123c may be greater than those of the light emitting devices 710a, 710b, and 710c, and accordingly, a gap may be formed between the light emitting devices 710a, 710b, and 710c and the light blocking layer 123.

The adhesive layer 125 is attached onto the transparent substrate 121. The adhesive layer 125 may cover the light blocking layer 123. The adhesive layer 125 may be attached onto an entire surface of the transparent substrate 121, without being limited thereto, or may be attached onto a portion of the transparent substrate 121 so as to expose a region near an edge of the transparent substrate 121. The adhesive layer 125 is used to attach the light emitting devices 710a, 710b, and 710c to the transparent substrate 121. The adhesive layer 125 may fill the windows 123a, 123b, and 123c formed in the light blocking layer 123.

The adhesive layer 125 may be formed of a light-transmitting layer, and transmits light emitted from the light emitting devices 710a, 710b, and 710c. The adhesive layer 125 may be formed using an organic adhesive. For example, the adhesive layer 125 may be formed using a transparent epoxy. In addition, the adhesive layer 125 may include a diffuser such as $SiO_2$, $TiO_2$, ZnO, or the like so as to diffuse light. The light diffuser prevents the light emitting devices 710a, 710b, and 710c from being viewed from the light exiting surface.

Meanwhile, the first through third light emitting devices 710a, 710b, and 710c are disposed on the transparent substrate 121. The first through the third light emitting devices 710a, 710b, and 710c may be attached to the transparent substrate 121 by the adhesive layer 125. The first through the third light emitting devices 710a, 710b, and 710c may be disposed to correspond to the windows 123a, 123b, and 123c of the light blocking layer 123.

The first through the third light emitting devices 710a, 710b, and 710c may be disposed on a flat surface of the adhesive layer 125 as shown in FIGS. 9B and 9C. The adhesive layer 125 may be disposed under lower surfaces of the light emitting devices 710a, 710b, and 710c. In another exemplary embodiment, the adhesive layer 125 may partially cover side surfaces of the first through third light emitting devices 710a, 710b, and 710c.

The first through the third light emitting devices 710a, 710b, and 710c may be, for example, a red light emitting device, a green light emitting device, or a blue light emitting device. A detailed configuration of each of the first through third light emitting devices 710a, 710b, and 710c will be described later in detail with reference to FIGS. 10A and 10B.

As shown in FIG. 9A, the first through third light emitting devices 710a, 710b, and 710c may be arranged side by side to form a horizontal line. In particular, when the transparent substrate 121 is a sapphire substrate, the sapphire substrate may include clean cut surfaces (e.g., m-plane) and remaining cut surfaces (e.g., a-plane) by a crystal plane depending on a cutting direction. For example, when cut in a rectangular shape, two cut surfaces (e.g., m-plane) on both sides may be cut cleanly along the crystal plane, and the other two cut surfaces (e.g., a-plane) disposed vertically to these cut surfaces may not. In this case, the clean cut surfaces of the sapphire substrate 121 may be flush with an arrangement direction of the light emitting devices 710a, 710b, and 710c. For example, in FIG. 9A, the clean cut surfaces (e.g., m-plane) may be disposed up and down, and the other two cut surfaces (e.g., a-plane) may be disposed on left and right.

In addition, major axis directions of the first through third light emitting devices 710a, 710b, and 710c may be arranged parallel to one another, respectively. Minor axis directions of the first through third light emitting devices 710a, 710b, and 710c may coincide with the arrangement direction of the light emitting devices.

The step adjustment layer 127 covers the first through the third light emitting devices 710a, 710b, and 710c and the adhesive layer 125. The step adjustment layer 127 has openings 127a exposing first and second electrode pads 761 and 763 of the light emitting devices 710a, 710b, and 710c. The step adjustment layer 127 assists to securely form the connection layers by uniformly adjusting elevations of surfaces on which the connection layers 129a, 129b, 129c, and 129d are formed. The step adjustment layer 127 may be formed of, for example, photosensitive polyimide.

The step adjustment layer 127 may be disposed in a region surrounded by an edge of the adhesive layer 125, without being limited thereto. For example, the step adjustment layer 127 may be formed so as to partially expose the edge of the adhesive layer 125.

A side surface of the step adjustment layer 127 may be inclined at an angle less than 90 degrees with respect to an upper surface of the adhesive layer 125. For example, the side surface of the step adjustment layer 127 may have an inclination angle of about 60 degrees with respect to the upper surface of the adhesive layer 125.

The first through the fourth connection layers 129a, 129b, 129c, and 129d are formed on the step adjustment layer 127. The connection layers 129a, 129b, 129c, and 129d may be connected to the first and second electrode pads 761 and 763 of the first through third light emitting devices 710a, 710b, and 710c through the openings 127a of the step adjustment layer 127.

In an exemplary embodiment, as shown in FIGS. 9A and 9B, the first connection layer 129a may be electrically connected to a second conductivity type semiconductor layer of the first light emitting device 710a, and the second connection layer 129b may be electrically connected to a second conductivity type semiconductor layer of the second light emitting device 710b, and the third connection layer 129c may be electrically connected to a second conductivity type semiconductor layer of the third light emitting device 710c, and the fourth connection layer 129d may be commonly electrically connected to the first conductivity type semiconductor layers of the first through the third light emitting devices 710a, 710b, and 710c. The first through the fourth connection layers 129a, 129b, 129c, and 129d may be formed together on the step adjustment layer 127, and may include, for example, Au.

In another exemplary embodiment, the first connection layer 129a may be electrically connected to the first conductivity type semiconductor layer of the first light emitting device 710a, and the second connection layer 129b may be electrically connected to the first conductivity type semiconductor layer of the second light emitting device 710b, the third connection layer 129c may be electrically connected to the first conductivity type semiconductor layer of the third light emitting device 710c, and the fourth connection layer 129d may be commonly electrically connected to the second conductivity type semiconductor layers of the first through third light emitting devices 710a, 710b, and 710c. The first through the fourth connection layers 129a, 129b, 129c, and 129d may be formed together on the step adjustment layer 127.

The insulation material layer 131 may be formed to have a thickness smaller than that of the step adjustment layer 127. A sum of the thicknesses of the insulation material layer 131 and the step adjustment layer 127 may be 1 μm or more and 50 μm or less, without being limited thereto. Meanwhile, a side surface of the insulation material layer 131 may have an inclination angle less than 90 degrees with respect to the upper surface of the adhesive layer 125, for example, an inclination angle of about 60 degrees.

The insulation material layer 131 covers the side surfaces of the step adjustment layer 127 and the connection layers 129a, 129b, 129c, and 129d. In addition, the insulation material layer 131 may cover a portion of the adhesive layer 125. The insulation material layer 131 has openings 131a, 131b, 131c, and 131d exposing the connection layers 129a, 129b, 129c, and 129d, and thus, pad regions of the unit pixel 100 may be defined.

In an exemplary embodiment, the insulation material layer 131 may be a translucent material, and may be formed of an organic or inorganic material. The insulation material layer 131 may be formed of, for example, polyimide. When the insulation material layer 131 together with the step adjustment layer 127 is formed of polyimide, the lower surfaces, side surfaces, and upper surfaces of the connection layers 129a, 129b, 129c, and 129d except for the pad regions may be all surrounded by polyimide.

Meanwhile, the unit pixel 700 may be mounted on the module substrate using a bonding agent such as solder, and the bonding agent may bond the connection layers 129a, 129b, 129c, and 129d exposed to the openings 131a, 131b, 131c, and 131d of the insulation material layer 131 and the pads on the module substrate.

According to the illustrated exemplary embodiment, the unit pixel 700 does not include separate bumps, and the connection layers 129a, 129b, 129c, and 129d are used as bonding pads. However, the inventive concepts are not limited thereto, and bonding pads covering the openings 131a, 131b, 131c, and 131d of the insulation material layer 131 may be formed. In an exemplary embodiment, the bonding pads may be formed so as to partially cover the light emitting devices 710a, 710b, and 710c outside upper regions of the first through the fourth connection layers 129a, 129b, 129c, and 129d.

In the illustrated exemplary embodiment, the light emitting devices 710a, 710b, and 710c have been described as being attached to the transparent substrate 121 by the adhesive layer 125, but the light emitting devices 710a, 710b, and 710c may be coupled to the transparent substrate 121 by using another coupler instead of the adhesive layer 125. For example, the light emitting devices 710a, 710b, and 710c may be coupled to the transparent substrate 121 using spacers, and thus, gases or liquids may fill a region between the light emitting devices 710a, 710b, and 710c and the transparent substrate 121. An optical layer that transmits light emitted from the light emitting devices 710a, 710b, and 710c may be formed by these gases or liquids. The above-mentioned adhesive layer 125 is also an example of the optical layer. Herein, the optical layer is formed of a material different from those of the light emitting devices 710a, 710b, and 710c, for example, gases, liquids, or solids, and thus, the material thereof is distinguished from those of the semiconductor layers in the light emitting devices 710a, 710b, and 710c.

The unit pixel 700 according to the illustrated exemplary embodiment may replace the unit pixels 100, 200, 300, 400, 500, and 600 described above. Accordingly, a plurality of unit pixels 700 may be arranged on the module substrate, and the light diffusion layer and the black molding layer having various structures described above may cover the unit pixels 700.

Figure 10A:
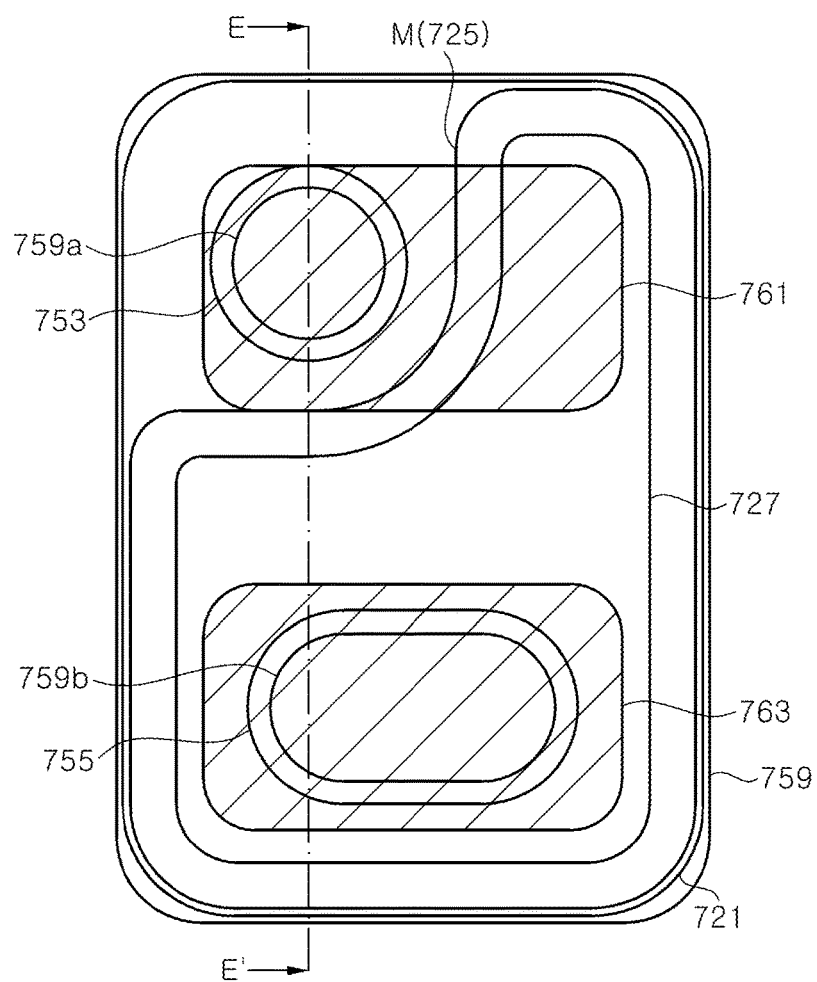
FIG. 10A is a schematic plan view illustrating a light emitting device of FIG. 9A.
Figure 10B:
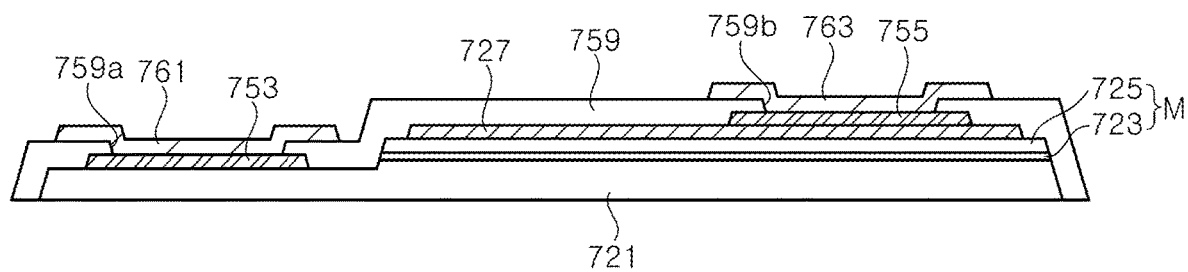
FIG. 10B is a schematic cross-sectional view taken along line E-E' of FIG. 10A.

FIG. 10A is a schematic plan view illustrating a light emitting device of FIG. 9A, and FIG. 10B is a schematic cross-sectional view taken along line E-E' of FIG. 10A. Herein, a light emitting device 710a has been exemplarily described, but as light emitting devices 710b and 710c also have substantially similar structures, repeated descriptions thereof will be omitted.

Referring to FIGS. 10A and 10B, the light emitting device 710a may include a light emitting structure including a first conductivity type semiconductor layer 721, an active layer 723, and a second conductivity type semiconductor layer 725, an ohmic contact layer 727, a first contact pad 753, a second contact pad 755, an insulation layer 759, a first electrode pad 761, and a second electrode pad 763.

The light emitting device 710a may have a rectangular shape having a major axis and a minor axis in plan view. For example, a length of the major axis may be 100 μm or less, and a length of the minor axis may be 70 μm or less. The light emitting devices 710a, 710b, and 710c may have a substantially similar shape and size. The shape of the light emitting device 710a is not limited to a rectangular shape having the major axis length and the minor axis length, but may be another external shape such as a square shape.

The light emitting structure, that is, the first conductivity type semiconductor layer 721, the active layer 723, and the second conductivity type semiconductor layer 725 may be grown on a substrate. The substrate may be various substrates that can be used for growing semiconductors, such as a gallium nitride substrate, a GaAs substrate, a Si substrate, a sapphire substrate, in particular a patterned sapphire substrate. The growth substrate may be separated from the semiconductor layers using techniques such as mechanical polishing, laser lift-off, chemical lift-off, or the like. However, the inventive concepts are not limited thereto, and a portion of the substrate may remain to constitute at least a portion of the first conductivity type semiconductor layer 721.

In an exemplary embodiment, in a case of the light emitting device 710a emitting red light, the semiconductor layers may include aluminum gallium arsenide (AlGaAs), gallium arsenide phosphide (GaAsP), aluminum gallium indium phosphide (AlGaInP), or gallium phosphide (GaP).

In a case of the light emitting device 710b emitting green light, the semiconductor layers may include indium gallium nitride (InGaN), gallium nitride (GaN), gallium phosphide (GaP), aluminum gallium indium phosphide (AlGaInP), or aluminum gallium phosphide (AlGaP).

In an exemplary embodiment, in a case of the light emitting device 710c emitting blue light, the semiconductor layer may include gallium nitride (GaN), indium gallium nitride (InGaN), or zinc selenide (ZnSe).

The first conductivity type and the second conductivity type have opposite polarities, when the first conductivity type is n-type, the second conductivity type is p-type, or when the first conductivity type is p-type, the second conductivity type becomes n-type.

The first conductivity type semiconductor layer 721, the active layer 723, and the second conductivity type semiconductor layer 725 may be grown on the substrate in a chamber using a known method such as metal organic chemical vapor deposition (MOCVD). In addition, the first conductivity type semiconductor layer 721 includes n-type impurities (e.g., Si, Ge, Sn), and the second conductivity type semiconductor layer 725 includes p-type impurities (e.g., Mg, Sr, Ba). In a case of the light emitting device 710b or 710c emitting green light or blue light, the first conductivity type semiconductor layer 721 may include GaN or AlGaN containing Si as a dopant, and the second conductivity type semiconductor layer 725 may include GaN or AlGaN containing Mg as a dopant.

Although the first conductivity type semiconductor layer 721 and the second conductivity type semiconductor layer 725 are illustrated as a single layer, respectively, in FIGS. 10A-10B, but these layers may be multi-layered and may also include a superlattice layer. The active layer 723 may include a single quantum well structure or a multiple quantum well structure, and a composition ratio of a compound semiconductor is adjusted so as to emit a desired wavelength. For example, the active layer 723 may emit blue light, green light, red light, or ultraviolet light.

The second conductivity type semiconductor layer 725 and the active layer 723 may have a mesa M structure and be disposed on the first conductivity type semiconductor layer 721. The mesa M may include the second conductivity type semiconductor layer 725 and the active layer 723, and may include a portion of the first conductivity type semiconductor layer 721 as shown in FIG. 10B. The mesa M may be disposed on a partial region of the first conductivity type semiconductor layer 721, and an upper surface of the first conductivity type semiconductor layer 721 may be exposed around the mesa M.

In the illustrated exemplary embodiment, the mesa M is formed so as to expose the first conductivity type semiconductor layer 721 around the mesa M. In another exemplary embodiment, a through hole may be formed through the mesa M to expose the first conductivity type semiconductor layer 721.

In an exemplary embodiment, the first conductivity type semiconductor layer 721 may have a flat light exiting surface. In another exemplary embodiment, the first conductivity type semiconductor layer 721 may have a concave-convex pattern by surface texturing on the light exiting surface side. The surface texturing may be performed, for example, by patterning using a dry or wet etching process. For example, cone-shaped protrusions may be formed on the light exiting surface of the first conductivity type semiconductor layer 721, and a height of the cone may be about 2 μm to about 3 μm, a distance between the cones may be about 1.5 μm to about 2 μm, and a diameter of a bottom of the cone may be about 3 μm to about 5 μm. The cone may also be truncated, in which an upper diameter of the cone may be about 2 μm to about 3 μm.

In another exemplary embodiment, the concave-convex pattern may include a first concave-convex pattern and a second concave-convex pattern additionally formed on the first concave-convex pattern.

By forming the concave-convex pattern on the surface of the first conductivity type semiconductor layer 721, total internal reflection may be reduced to increase light extraction efficiency. Surface texturing may be performed on the first conductivity type semiconductor layers of all of the first, second, and third light emitting devices 710a, 710b, and 710c, and thus, viewing angles of light emitted from the first, second, and third light emitting devices 710a, 710b, and 710c may become uniform. However, the inventive concepts are not limited thereto, and at least one of the light emitting devices 710a, 710b, and 710c may have a flat surface without including the concave-convex pattern.

The ohmic contact layer 727 is disposed on the second conductivity type semiconductor layer 725 to be ohmic contact with the second conductivity type semiconductor layer 725. The ohmic contact layer 727 may be formed of a single layer or multiple layers, and may be formed of a transparent conductive oxide film or a metallic film. The transparent conductive oxide film may include, for example, ITO, ZnO, or the like and the metallic film may include metals such as Al, Ti, Cr, Ni, Au, Ge, Pt, or the like and alloys thereof.

The first contact pad 753 is disposed on the exposed first conductivity type semiconductor layer 721. The first contact pad 753 may be in ohmic contact with the first conductivity type semiconductor layer 721. For example, the first contact pad 753 may be formed of an ohmic metal layer in ohmic contact with the first conductivity type semiconductor layer 721. The ohmic metal layer of the first contact pad 753 may be appropriately selected depending on a semiconductor material of the first conductivity type semiconductor layer 721. The first contact pad 753 may be omitted.

The second contact pad 755 may be disposed on the ohmic contact layer 727. The second contact pad 755 is electrically connected to the ohmic contact layer 727. The second contact pad 755 may be omitted.

The insulation layer 759 covers the mesa M, the ohmic contact layer 727, the first contact pad 753, and the second contact pad 755. The insulation layer 759 has openings 759a and 759b exposing the first contact pad 753 and the second contact pad 755. The insulation layer 759 may be formed of a single layer or multiple layers. The insulation layer 759 may include an insulating material such as $SiO_2$, SiNx, $Al_2O_3$, or the like, and further, the insulation layer 759 may include a distributed Bragg reflector in which insulation layers having different refractive indices are stacked. For example, the distributed Bragg reflector may include at least two insulation layers selected from $SiO_2$, $Si_3N_4$, SiON, $TiO_2$, $Ta_2O_5$, $Nb_2O_5$, and $MgF_2$.

The distributed Bragg reflector reflects light emitted from the active layer 723. The distributed Bragg reflector may exhibit a high reflectivity over a relatively wide wavelength range including a peak wavelength of light emitted from the active layer 723, and may be designed in consideration of an incident angle of light. In an exemplary embodiment, the distributed Bragg reflector may have a higher reflectivity for light incident at an angle of incidence of 0 degree compared to that of light incident at other angles of incidence. In another exemplary embodiment, the distributed Bragg reflector may have a higher reflectivity for light incident at another specific angle of incidence compared to that of light incident at the angle of incidence of 0 degree. For example, the distributed Bragg reflector may have a higher reflectivity for light incident at an angle of incidence of 10 degrees compared to that of light incident at the angle of incidence of 0 degree.

Meanwhile, the light emitting structure of the blue light emitting device 710c has higher internal quantum efficiency than the light emitting structures of the red light emitting device 710a and the green light emitting device 710b. Accordingly, the blue light emitting device 710c may exhibit a light extraction efficiency higher than that of the red and green light emitting devices 710a and 710b. Accordingly, it may be difficult to properly maintain a color mixing ratio of red light, green light, and blue light.

To adjust the color mixing ratio of red light, green light, and blue light, the distributed Bragg reflectors applied to the light emitting devices 710a, 710b, and 710c may be formed to have different reflectivities from one another. For example, the blue light emitting device 710c may have a distributed Bragg reflector having a relatively low reflectivity compared to those of the red and green light emitting devices 710a and 710b. For example, the distributed Bragg reflector formed in the blue light emitting device 710c may have a reflectivity of 95% or less at the incident angle of 0 degrees for blue light generated in the active layer 723, and further 90% or less, the distributed Bragg reflector formed in the green light emitting device 710b may have a reflectivity of about 95% or more and 99% or less at the incident angle of 0 degrees for green light, and the distributed Bragg reflector formed in the red light emitting device 710a may have a reflectivity of 99% or more at the incident angle of 0 degrees for red light.

In an exemplary embodiment, the distributed Bragg reflectors applied to the red, green, and blue light emitting devices 710a, 710b, and 710c may have a substantially similar thickness. For example, a difference in thicknesses between the distributed Bragg reflectors applied to these light emitting devices 710a, 710b, and 710c may be less than 10% of a thickness of a thickest distributed Bragg reflector. By reducing the difference in thicknesses of the distributed Bragg reflectors, process conditions applied to the red, green, and blue light emitting devices 710a, 710b, and 710c, for example, a process of patterning the insulation layer 759 may be set similarly, and furthermore, it is possible to prevent a fabrication process of the unit pixel from becoming complicated. Furthermore, the distributed Bragg reflectors applied to the red, green, and blue light emitting devices 710a, 710b, and 710c may have a substantially similar stacking number. However, the inventive concepts are not limited thereto.

In another exemplary embodiment, different light emitting devices 710a, 710b, and 710c may include different insulation layers 759 from one another. For example, the red light emitting device 710a may have the distributed Bragg reflector described above, and the green and blue light emitting devices 710b and 710c may have a single insulation layer 759.

The first electrode pad 761 and the second electrode pad 763 are disposed on the insulation layer 759. The first electrode pad 761 may extend from an upper portion of the first contact pad 753 to an upper portion of the mesa M, and the second electrode pad 763 may be disposed in an upper region of the mesa M. The first electrode pad 761 may be connected to the first contact pad 753 through the opening 759a, and the second electrode pad 763 may be electrically connected to the second contact pad 755. The first electrode pad 761 may be directly in ohmic contact with the first conductivity type semiconductor layer 721, and in this case, the first contact pad 753 may be omitted. In addition, when the second contact pad 755 is omitted, the second electrode pad 763 may be directly connected to the ohmic contact layer 727.

The first and/or second electrode pads 761 and 763 may be formed of a single-layered or multi-layered metal. As a material of the first and/or second electrode pads 761 and 763, metals such as Al, Ti, Cr, Ni, Au, or and alloys thereof may be used. For example, the first and second electrode pads 761 and 763 may include a Ti layer or a Cr layer on an uppermost end, and an Au layer thereunder.

Although the light emitting device 710a according to an exemplary embodiment of the present disclosure has been briefly described with the drawings, the light emitting device 710a may further include a layer having an additional function in addition to the above-described layer. For example, various layers such as a reflection layer that reflects light, an additional insulation layer to insulate a specific element, and a solder prevention layer to prevent diffusion of solder may be further included.

In addition, in forming a flip-chip type light emitting device, the mesa may be formed in various shapes, and locations or shapes of the first and second electrode pads 761 and 763 may also be variously modified. Moreover, the ohmic contact layer 727 may be omitted, and the second contact pad 755 or the second electrode pad 763 may directly contact the second conductivity type semiconductor layer 725.

Although some embodiments have been described herein, it should be understood that these embodiments are provided for illustration only and are not to be construed in any way as limiting the present disclosure. It should be understood that features or components of an exemplary embodiment can also be applied to other embodiments without departing from the spirit and scope of the present disclosure.

The invention claimed is:

1. A light emitting module, comprising:
a module substrate;
a protection layer disposed on the module substrate and exposing portions of the module substrate and pads, the protection layer configured to block soldering of the pads and prevent an electrical short circuit between the pads;
a plurality of unit pixels disposed on the module substrate, each unit pixel including a connection electrode electrically connected to the pads; and
a molding layer covering the plurality of unit pixels, wherein:
the molding layer further includes a light diffusion layer and a black molding layer,
at least one of the light diffusion layer or the black molding layer includes one or more patterns, and
a side surface of the module substrate, a side surface of the light diffusion layer, and a side surface of the black molding layer are located on a same plane.

2. The light emitting module of claim 1,
wherein the light diffusion layer includes a first pattern on an upper surface of the light diffusion layer and the black molding layer includes a second pattern on an upper surface surface of the black molding layer.

3. The light emitting module of claim 1,
wherein each element of the one or more patterns includes a hemispherical pattern, a conical pattern, or a grid pattern.

4. The light emitting module of claim 1,
wherein the light diffusion layer includes a convex portion on the plurality of unit pixels.

5. The light emitting module of claim 4, wherein:
the light diffusion layer further includes a first pattern; and
a first interval between first elements of the first pattern on the convex portion is greater than a second interval between second elements of the first pattern,
the second elements of the first pattern formed on an upper surface of the light diffusion layer and disposed in a region between the plurality of unit pixels.

6. The light emitting module of claim 5, wherein:
the black molding layer includes a second pattern, and
elements of the second pattern of the black molding layer are spaced apart from one another at a substantially constant interval.

7. The light emitting module of claim 1,
wherein a first thickness from an uppermost end of the light diffusion layer on the plurality of unit pixels to the module substrate is greater than or equal to a second thickness from an upper surface of the light diffusion layer disposed in a region between the plurality of unit pixels to the module substrate.

8. The light emitting module of claim 7,
wherein the second thickness of the light diffusion layer disposed in the region between the plurality of unit pixels is greater than a height of each of the plurality of unit pixels.

9. The light emitting module of claim 1,
wherein each of the plurality of unit pixels includes:
a first LED stack, a second LED stack, and a third LED stack that are vertically stacked, or
at least three light emitting devices arranged on the same plane.

10. A display apparatus, comprising:
a display substrate; and
a plurality of light emitting modules arranged on the display substrate, each of the plurality of light emitting modules including a light emitting module that comprises:
a module substrate;
a protection layer disposed on the module substrate and exposing portions of the module substrate and pads, the protection layer configured to block soldering of the pads and prevent an electrical short circuit between the pads;
a plurality of unit pixels disposed on the module substrate, each unit pixel including a connection electrode electrically connected to the pads; and
a molding layer covering the plurality of unit pixels, wherein:
the molding layer further includes a light diffusion layer and a black molding layer,
at least one of the light diffusion layer or the black molding layer includes one or more patterns, and
a side surface of the module substrate, a side surface of the light diffusion layer, and a side surface of the black molding layer are located on a same plane.

11. The display apparatus of claim 10,
wherein the light diffusion layer includes a first pattern on an upper surface of the light diffusion layer and the black molding layer includes a second pattern on an upper surface surface of the black molding layer.

12. The display apparatus of claim 10,
wherein each element of the one or more patterns includes a hemispherical pattern, a conical pattern, or a grid pattern.

13. The display apparatus of claim 10,
wherein the light diffusion layer includes a convex portion on the plurality of unit pixels.

14. The display apparatus of claim 13, wherein:
the light diffusion layer further includes a first pattern; and
a first interval between first elements of the first pattern on the convex portion is greater than a second interval between second elements of the first pattern, the second elements of the first pattern formed on an upper surface of the light diffusion layer and disposed in a region between the plurality of unit pixels.

15. The display apparatus of claim 14, wherein:
the black molding layer includes a second pattern, and
elements of the second pattern of the black molding layer are spaced apart from one another at a substantially constant interval.

16. The display apparatus of claim 10,
wherein a first thickness from an uppermost end of the light diffusion layer on the plurality of unit pixels to the module substrate is greater than or equal to a second thickness from an upper surface of the light diffusion layer disposed in a region between the plurality of unit pixels to the module substrate.

17. The display apparatus of claim 16,
wherein the second thickness of the light diffusion layer disposed in the region between the plurality of unit pixels is greater than a height of each of the plurality of unit pixels.

18. The display apparatus of claim 10,
wherein each of the plurality of unit pixels includes:
a first LED stack, a second LED stack, and a third LED stack that are vertically stacked, or
at least three light emitting devices arranged on the same plane.

19. A light emitting module, comprising:
a module substrate;
a plurality of unit pixels disposed on the module substrate; and
a molding layer covering the plurality of unit pixels, wherein:
the molding layer further includes a light diffusion layer and a black molding layer,
at least one of the light diffusion layer or the black molding layer includes one or more patterns, and
a side surface of the module substrate, a side surface of the light diffusion layer, and a side surface of the black molding layer are located on a same plane,
wherein the light diffusion layer includes a convex portion on the plurality of unit pixels, and
wherein the light diffusion layer further includes a first pattern,
wherein a first interval between first elements of the first pattern on the convex portion is greater than a second interval between second elements of the first pattern, and
wherein the second elements of the first pattern formed on an upper surface of the light diffusion layer and disposed in a region between the plurality of unit pixels.

20. The light emitting module of claim 19, wherein:
the black molding layer includes a second pattern, and
elements of the second pattern of the black molding layer are spaced apart from one another at a substantially constant interval.

* * * * *